US006970385B2

(12) United States Patent
Sakakibara

(10) Patent No.: US 6,970,385 B2
(45) Date of Patent: Nov. 29, 2005

(54) NON-VOLATILE SEMICONDUCTOR MEMORY DEVICE SUPPRESSING WRITE-BACK FAULT

(75) Inventor: Kiyohiko Sakakibara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 148 days.

(21) Appl. No.: 10/374,971

(22) Filed: Feb. 28, 2003

(65) Prior Publication Data
US 2004/0047187 A1 Mar. 11, 2004

(30) Foreign Application Priority Data
Sep. 6, 2002 (JP) ............................. 2002-261349

(51) Int. Cl.[7] .............................................. G11C 16/04
(52) U.S. Cl. ............ 365/185.29; 365/148; 365/185.05; 365/185.18; 365/185.23; 365/185.24; 365/185.28; 365/189.05; 365/189.07; 365/189.09; 365/230.06; 365/230.08
(58) Field of Search ...................... 365/185.29, 185.19, 365/185.28, 185.24, 185.23, 185.18, 185.05, 365/148, 189.09, 230.06, 189.07, 230.08, 365/189.05

(56) References Cited

U.S. PATENT DOCUMENTS

| 4,279,024 | A | * | 7/1981 | Schrenk ................. 365/185.22 |
| 5,428,568 | A | * | 6/1995 | Kobayashi et al. .... 365/185.24 |
| 5,546,340 | A | | 8/1996 | Hu et al. |
| 5,555,521 | A | * | 9/1996 | Hamada et al. ........ 365/185.03 |
| 5,576,992 | A | * | 11/1996 | Mehrad ................. 365/185.24 |
| 5,659,504 | A | | 8/1997 | Bude et al. |
| 5,687,117 | A | * | 11/1997 | Chevallier et al. ..... 365/185.12 |
| 5,748,531 | A | * | 5/1998 | Choi ...................... 365/185.18 |
| 5,907,506 | A | * | 5/1999 | Jinbo .................... 365/185.29 |
| 5,959,884 | A | * | 9/1999 | Chevallier et al. ..... 365/185.05 |
| 5,970,012 | A | * | 10/1999 | Takeshima ............. 365/230.01 |
| 6,222,774 | B1 | * | 4/2001 | Tanzawa et al. ....... 365/185.29 |

(Continued)

FOREIGN PATENT DOCUMENTS

JP 11-134876 5/1999

OTHER PUBLICATIONS

Yamada et al., "A Self-Convergence Erase for NOR Flash EEPROM Using Avalanche Hot Carrier Injection", appeared in IEEE Transactions on Electronic Devices, vol. 43, pp. 1937-1941, 1996.

Primary Examiner—Hoai Ho
Assistant Examiner—Ly Duy Pham
(74) Attorney, Agent, or Firm—Leydig, Voit & Mayer, Ltd.

(57) ABSTRACT

A resistor is connected to a source line of memory cells, a write-back operation is performed to memory cells on a single unit basis. With the resistor connected, there is suppressed, in a self-adjusting manner, channel leakage current flowing in a memory cell having a low threshold voltage in an over-erased state. There is assured an output voltage of a charge pump circuit supplying a drain voltage at a high potential necessary for forming a high electric field for generating sub-threshold CHE (Channel Hot Electron) in memory cells to be singly written back. As a result, a non-volatile semiconductor memory device can suppress a write back fault due to an increase in channel leakage current, in a self-selective write-back method using sub-threshold CHE.

12 Claims, 16 Drawing Sheets

U.S. PATENT DOCUMENTS

| | | |
|---|---|---|
| 6,288,941 B1 * | 9/2001 | Seki et al. ............. 365/185.12 |
| 6,330,185 B1 * | 12/2001 | Wong et al. ........... 365/185.03 |
| 6,348,370 B1 * | 2/2002 | Mehrad et al. ............. 438/210 |
| 6,356,480 B1 | 3/2002 | Sakakibara et al. |
| 6,445,617 B1 | 9/2002 | Sakakibara |
| 6,449,188 B1 * | 9/2002 | Fastow .................. 365/185.18 |
| 6,671,208 B2 * | 12/2003 | Sumitani et al. ........ 365/185.23 |
| 2001/0024859 A1 * | 9/2001 | Takahashi et al. ........... 438/286 |
| 2002/0159315 A1 * | 10/2002 | Noguchi et al. ............. 365/200 |
| 2003/0053356 A1 * | 3/2003 | Sakamoto .................... 365/200 |
| 2003/0072202 A1 * | 4/2003 | Kanamitsu et al. ......... 365/200 |
| 2003/0117847 A1 * | 6/2003 | Makuta et al. ......... 365/185.09 |
| 2003/0198083 A1 * | 10/2003 | Akaogi et al. ......... 365/185.09 |

* cited by examiner

|  | Vd | Vcg | Vs | Vsub |
|---|---|---|---|---|
| IN PROGRAM | 4~5V | 10V | 0V | 0V |
| IN WRITING BACK | 4~5V | 0V | 0V | 0V |
| IN READING | ~1V | 5V | 0V | 0V |

Vth DISTRIBUTION PRIOR TO ERASE PULSE APPLICATION

Vth DISTRIBUTION IN COURSE OF ERASURE

Vth DISTRIBUTION AFTER ERASURE ENDS

NON-VOLATILE SEMICONDUCTOR MEMORY DEVICE SUPPRESSING WRITE-BACK FAULT

BACKGROUND OF THE INVENTION

1. Field of the Invention

The present invention relates to a non-volatile semiconductor memory device, and more particularly to a non-volatile semiconductor memory device having a floating gate type memory element.

2. Description of the Background Art

FIG. 11 is a circuit diagram showing a circuit configuration of a memory cell array in a non-volatile semiconductor memory device such as a conventional flash memory. In FIG. 11, there is shown, as one example, a circuit configuration of a memory cell array in a NOR type flash memory.

Referring to FIG. 11, so-called floating gate type memory cell transistors are arranged in a matrix and word lines WLm−1 to WLm+1 and bit lines BLn−1 to BLn+1 (m,n: a natural number) are arranged in row and column directions, respectively. The drain, source and gate of each memory cell transistor is connected to a bit line, a source line and a word line, respectively. For the figure, description will be given of a memory cell transistor MT (m, n) encircled with a dotted line as an example and the drain of the memory cell transistor MT (m, n) is connected to a bit line BLn and the source thereof is connected to a source line SL common to memory cell transistors and the gate thereof is connected to a word line WLm.

FIG. 12 is a sectional view schematically showing a structure of a floating gate type memory cell transistor.

Referring to FIG. 12, a drain region D and a source region S are formed on a main surface of a semiconductor substrate SUB. A floating gate F is formed in a layer above a channel region between drain region D and source region S with an insulating film interposed between itself and the channel region, and a control gate G is formed on a layer further thereabove with an insulating film interposed therebetween. A drain voltage Vd, a source voltage Vs, a control gate voltage Vcg and a substrate voltage Vsub are applied to drain region D, source region S control gate G and semiconductor substrate SUB, respectively.

Description will be given of data writing with channel hot electrons (hereinafter, referred to as "CHE") in a floating gate type memory cell transistor.

FIG. 13 is a table showing a general voltage arrangement in data writing with CHE in the floating gate type memory cell transistor shown in FIG. 12. In the table, voltage "in program" corresponds to a voltage arrangement in data writing.

Referring to FIGS. 12 and 13, when drain voltage Vd of 4 to 5 V is given, a high electric field region is formed in the vicinity of drain region D. Electrons flowing in a channel region from source region S toward drain region D are driven into an high energy state in this high electric field region. CHE whose energy is raised to a value equal to or higher than 3.8 eV, which is a potential barrier $\phi b$ at an oxide insulating film interface between the channel region and floating gate F, are attracted toward floating gate F under an electric field generated by control gate voltage Vcg applied to control gate G and injected into floating gate F.

Unless electrons have not been accumulated in floating gate F prior to the injection of CHE, the potential of floating gate F at an initial stage of the injection takes a potential determined by $\alpha cg \times Vcg$. Here, $\alpha cg$ is a capacitive coupling coefficient and generally on the order of 0.7. Therefore, when control gate voltage Vcg is 10 V, potential of floating gate F takes a value of the order of 7 V and, under the potential, CHE are attracted and injected into floating gate F. A state in which CHE have been injected into floating gate F is called "a program state," which corresponds to a state where data "0" is stored. On the other hand, a state where no CHE has been injected into floating gate F is called an "erase state," which corresponds to a state where data "1" is stored.

Data reading is performed as follows. In a program state, by injecting electrons into floating gate F, a threshold voltage Vth of a memory cell transistor rises relative to control gate G. Therefore, as shown in FIG. 13, even if drain voltage Vd of the order of 1 V is given and a voltage of 5 V is given to control gate voltage Vcg, a memory cell transistor is not turned on and no channel current flows. On the other hand, in an erase state, by applying a voltage of 5 V higher than a threshold voltage in the erase state to control gate Vcg, the memory cell transistor is turned on.

Therefore, when drain voltage Vd of the order of 1 V is applied and a voltage of 5 V is applied as control gate voltage Vcg, reading of storage data is determined by whether or not a current flows in a memory cell transistor.

A storage state where electrons have been once injected into the floating gate is held in the floating gate till an erase pulse is applied, and since no electron injection into a floating gate is performed as far as a prescribed voltage for program is not applied, an electron state in the floating gate is held even if a device power supply is tuned off. That is, a non-volatile memory is thus realized.

In a flash memory, a strong demand for a single power supply has been built up in recent years and in order to satisfy such a demand, generally a charge pump circuit is provided inside a device. That is, only a desired single power supply (3.3 V, 2.5 V or the like) is supplied externally to a logic circuit system inside the device and a voltage higher than the above single power supply voltage, which is required in data writing to a memory cell transistor or in erasure therein described later, is generated by a charge pump circuit.

The charge pump circuit is required to be used within a range not exceeding a current drive ability of the charge pump circuit in order to stably generate a desired boosted voltage. The current drive ability of a charge pump circuit is generally proportional to an area of the charge pump circuit.

In a case where data is written by injecting CHE into a floating gate, a current of the order from 150 to 200 $\mu$A flows in one memory cell transistor for an instant at an initial stage of the writing. In order to reduce a data write time, in a NOR type flash memory, simultaneous data writing is generally performed to 8 bits or 16 bits (that is 8 or 16 memory cell transistors). Therefore, in this case, a charge pump circuit needs a current drive ability of the order of 200 $\mu$A×16 bits=3.2 mA at an initial stage of a write operation. When the charge pump circuit cannot drive this amount of current, a desired boosted voltage is not given to the memory cell transistor with the result of occurrence of a write operation fault.

A change toward a low voltage given to a device has increasingly progressed: such as from 3.3 V to 2.5 V and further 1.8 V, in these several years and, along with the state, a required current drive ability of a charge pump circuit has also increased, which, in turn, increases an occupancy area of the charge pump circuit on the device. From the viewpoint of a low cost, it is important to reduce an area of a charge pump circuit and to thereby decrease a size of a device and, in order to reduce an area of the charge pump circuit, it is necessary to suppress a current drive ability of the charge pump circuit by suppressing a channel current in CHE injection.

As methods suppressing a channel current, a method is described in U.S. Pat. No. 5659504. According to this method, by applying a negative bias of the order of −1 V to a semiconductor substrate, a channel current is suppressed by a substrate bias effect. Furthermore, by enhancing a potential difference between the gate and the substrate, electrons each having energy in the vicinity of a potential barrier at an insulating oxide film interface are attracted to a floating gate. As a result of the attraction, an injection efficiency of CHE rises while suppressing a channel current when CHE are injected, thereby enabling efficient writing.

On the other hand, while, in a flash memory, erasure of data is performed by extracting electrons having been injected into the floating gate, electrons at this time are excessively extracted from the floating gate by chance, a threshold voltage Vth of a memory cell transistor relative to the control gate enters a depletion state (Vth <0); a so-called over-erased state is generated.

FIGS. 14 to 16 are graphs showing transitions of distributing states of a threshold voltage Vth concerning a memory cell transistor on a memory cell array in erasure.

FIG. 14 is a graph showing a distribution of values of a threshold voltage prior to erasure.

Referring to FIG. 14, in a state prior to erasure, distributions of a threshold voltage is altered in two ways between a program state and an erasure state. Note that the ordinate of a graph used for plotting the number of memory cell transistors each holding a threshold voltage on a memory cell array.

FIG. 15 is a graph showing a distribution of a threshold voltage in the course of erasure. The erasure is performed by repetition of application of an erase pulse with a prescribed width to a memory cell transistor, and an erase verify determination to confirm a threshold voltage combined.

Referring to FIG. 15, by applying an erase pulse to memory cell transistors, a peak of a threshold voltage Vth shifts in a direction of a decrease in threshold voltage.

FIG. 16 is a graph showing a distribution of a threshold voltage Vth after erasure ends.

Referring to FIG. 16, since erase verify has been completed on all memory cell transistors, threshold voltages Vth of all the memory cell transistors are lower than an erase verify voltage 3.5 V. There arise considerable variations in threshold voltages of the memory cell transistors, however. As a result, it is shown with a hatched portion with oblique lines that there are memory cell transistors in a depletion state in which a threshold voltage Vth is 0 V or lower, that is in an ever-erased state.

In a memory cell transistor structure of a flash memory, especially, having an array structure called a NOR type or a DINOR (Divided bit line NOR) type, the presence of even a single memory cell transistor in an over-erased state disables correct measurement of threshold voltages Vth of all the other memory cell transistors on a bit line to which the memory cell transistor in an over-erased state. That is, no normal read operation can be performed on memory cell transistors connected to the bit line.

The reason for such an inconvenience is that, in FIG. 11, for example, in a case where memory cell transistor MT (m, n) is in a depletion state while threshold voltages Vth of other memory cell transistors on bit line BLn are even in an enhancement state (Vth >0), a current flows in memory cell transistor MT (m, n) when a voltage is applied to bit line BLn for measurement of threshold voltages of the other memory cell transistors even if no voltage is applied to word line WLn to which memory cell transistor MT (m, n) in a depletion state is connected.

As a measure to eliminate a problem of a memory cell transistor in an over-erased state, a self-selective write-back method with a drain avalanche gate current is reported by Yamada et al. in an article titled "A Self-Convergence Erase for NOR Flash EEPROM Using Avalanche Hot Carrier Injection", appeared in IEEE Transactions on Electron Devices, Vol. 43, p. 1937–1941, 1996.

As another method to eliminate the problem of a memory cell transistor in an over-erased state, a self-selective write-back method using sub-threshold CHE has been proposed by the inventors of the present application.

The latter method enables injection of CHE into floating gate with a low drain voltage and performs writing-back using memory cell transistors with an enhanced injection efficiency of CHE. By using memory cell transistors according to this method, a voltage arrangement in a write-back operation shown in FIG. 13 is set and thereby a leak current of the order in the range of from 0.1 to tens of $\mu$A self-selectively flows in a memory cell transistor in an over-erased state.

FIG. 17 is a graph conceptually showing a gate voltage Vg dependency of a drain current of a single memory cell transistor.

Referring to FIG. 17, a threshold voltage is defined as a value of a control gate voltage Vg when a current value flowing in a memory cell transistor reaches a prescribed standard value Id_read. A curve C1 is a characteristic curve of a memory cell transistor when a threshold voltage Vth is at an erase verify level, that is the maximum threshold voltage max. Vth after erasure. A curve C2 is a characteristic curve of a memory cell transistor when a threshold voltage Vth is at a write-back verify level, that is at the minimum threshold value min. Vth after writing-back. A curve C3 is a characteristic curve of a memory cell transistor in an over-erased state.

When a voltage in a write-back operation shown in FIG. 13 is applied to a memory cell transistor to be erased, a leak current of the order in the range of from 0.1 to tens of $\mu$A per bit flows through a channel region in a memory cell transistor in an over-erased state as shown with the curve C3 in FIG. 13 even if control gate voltage Vg is 0 V. CHE are generated by this leak current itself in a high electric field region in the vicinity of the drain region and injected into the floating gate to thereby cause writing-back to be self-selectively performed in the memory cell transistor in an over-erased state.

FIG. 18 is a graph showing a manner in which a memory cell transistor in an over-erased state is written back over time.

Refreezing to FIG. 18, a threshold voltage Vth, as shown with the curve A, becomes asymptotic to 1.5 V in about 1 ms, which is a write-back verify level. Note that description will be given of the curve B later.

FIG. 19 is a graph showing a manner in which a memory cell transistor in an over-erased state has been written back and a distribution of a threshold voltage has been narrowed in width.

Referring to FIG. 19, self-selective writing-back is performed in a memory cell transistor corresponding to black circles, which were of low threshold voltage prior to writing-back to thereby raise the threshold voltages.

FIG. 20 is a flow chart for describing an erase sequence in writing-back using self-selective writing-back.

Referring to FIG. 20, an erase sequence starts (step S100) and when an input of an erase command is received from outside (step S102), a write operation prior to erasure is at first performed (step S104). Then, application of an erase pulse (step S106) and a erase verify determination (step S108) combined are repeated till a threshold voltage of a memory cell transistor with a maximum threshold voltage in a threshold voltage Vth distribution after erasure takes an erase verify level.

In succession, after an erase operation is completed (step S108), a write-back pulse is non-selectively applied to a bit line and a memory cell transistor in an over-erased state present on a bit line onto which a bit line potential is self-selectively written back (step S110). Then, the process ends when threshold voltages of all the memory cell transistors exceed a write-back verify level (step S112).

A trend to adopt a lower operating voltage by a device, as described above, has advanced in recent years and in company with this trend, an occupancy area of a charge pump circuit in a device has increased in order to secure a current drive ability of a charge pump circuit. Therefore, a great problem currently exists that an area of a charge pump circuit is reduced to in turn, decrease a size of a device.

It is in writing-back when an electron injection is singly performed on floating gates in each array or each prescribed block as a unit basis rather than in writing when electron injection into a floating gate of a selected memory cell transistor that a current drive ability of a charge pump circuit is problematic. Therefore, in order to reduce an area of a charge pump circuit, a necessity arises for suppressing a channel current in a write-back operation to thereby suppress a current drive ability of the charge pump circuit.

The method described in above U.S. Pat. No. 5,659,504 is a method associated with a write operation, wherein a channel current in CHE injection is suppressed while enhancing an injection efficiency of CHE, and which can also be applied in a write-back operation. According to the measure, however, a new negative potential of the order of −1 V has to be generated on a semiconductor substrate. Therefore, this method requires a voltage generating circuit generating a new negative substrate potential, though an occupancy area of a charge pump circuit generating drain voltage Vd can be reduced as a result of suppression of a channel current in CHE injection from the viewpoint of reduction in area of the charge pump circuit.

On the other hand, a self-selective write-back method using a drain avalanche gate current has strong points, of requiring no bit selection, and capable of performing writing-back self-convergently. Furthermore, since generation of potentials may be in almost the same setting as in a write operation, requirement arises for neither a circuit for selecting a memory cell transistor in an over-erased state nor a potential setting circuit for writing-back. Since a convergence current flows over the entire array, however, a drive current in a write-back operation is large and in addition, since electron injection and hole injection into a floating gate generates simultaneously, a problem arises that a channel conductance of a memory cell transistor is degraded.

The above prior art self-selective write-back method using sub-threshold CHE, similar to the self-selective write-back method using a drain avalanche gate current, has strong points, of requiring no bit selection, and capable of performing writing-back self-convergently. Generation of potentials may be in the same setting as in a write operation. Since a channel current is increasingly cutting off in state of writing-back, a drive current is progressively reducing as writing-back advances. Furthermore, since only electrons are injected into a floating gate, an advantage can be enjoyed that no channel conductance is degraded as compared with the above self-selective write-back method using drain avalanche gate current.

As pointed out in description of the above charge pump circuit, however, there remains a problem to increase a time till convergence is reached if reduction in voltage generates in single writing-back of each prescribed number of memory cell transistors as a unit basis from the viewpoint of a time required for writing-back and a circuit configuration. Note that this problem is true for the self-selective write-back method using a drain avalanche gate current.

Detailed description will be given of the problem below.

FIG. 21 is a graph conceptually describing a total of leak currents when a single writing-back is performed on a prescribed number of memory cell transistors with a self-selective write-back method.

Referring to FIG. 21, the abscissa is assigned to a threshold voltage of a memory cell transistor to be written back, while the ordinate is used for plotting a total of leak currents of the memory cell transistor.

When a writing-back is singly performed on a prescribed number of memory cell transistors by means of the self-selective write-back method, leak current has two current components. That is, one is a junction leak current flowing in all memory cell transistors and the other is a channel leak current flowing in a memory cell transistor in a low threshold voltage state. Here, the junction leak current is generated at a p-n junction, and depends on an applied bit line voltage but does not depend on a threshold voltage. The junction leak current is on the order of several nA as a maximum value per memory cell transistor. On the other hand, a channel leak current flows in a channel region between the source region and the drain region and an amount thereof increases at a lower threshold voltage. A channel leak current is on the order of 0.1 to tens of $\mu A$ per memory cell transistor with a threshold voltage of 0 V.

In a case where a distribution of threshold voltages Vth of memory cell transistors to be written back is a high state, a junction leak current is dominant. On the other hand, a distribution of threshold voltages Vth is in a low state, a channel leak current is dominant in a total leak current. For example, a threshold voltage also varies by an influence of peripheral circuits from fluctuation in process parameters and thereby, if a threshold voltage Vth in an erased state is reduced to be lower or a distribution width of thresholds of memory cell transistors to be written back is broadened, a channel leak current increases.

As described above, a write-back operation is desirably performed collectively on a prescribed number of memory cell transistors from the viewpoint of time required for writing-back and a circuit configuration, memory cell transistors corresponding to the numbers of bits of 64 kB, generally, are subjected to a single writing-back. At this time, if a memory cell transistor is of a threshold voltage as low as 0.5 V or lower and a channel leak current of 1 $\mu A$ on average flows therein, only a channel leak current of the order of 4 mA flows in total. On the other hand, a current drive ability of a charge pump circuit driving a bit line voltage is in most cases designed to be on the order of 3 mA based on a necessary ability in a write operation as described above; therefore a circuit area thereof would increase in order to cope with a current drive ability more than the value.

FIG. 22 is a graph showing a relationship between a total of leak currents in a write-back operation and an output voltage of a charge pump circuit.

Referring to FIG. 22, in a case where a current drive ability of a charge pump circuit is designed to be 3 mA, the charge pump circuit outputs a prescribed output voltage, as far as a total of leak currents does not exceed 3 mA of the upper limit of a current drive ability. On the other hand, if a total of leak currents exceeds 3 mA of the upper limit of a current drive ability, an output voltage of the charge pump circuit is on the decrease with a total of leak currents.

A decrease in output voltage of the charge pump circuit, that is a decrease in applied drain voltage hinders generation of a high electric field in the drain region of a memory cell transistor with the result that a generation efficiency of CHE is reduced, thereby making it difficult to produce sub-threshold CHE for eliminating an over-erased state.

That is, at an initial stage of writing-back, there are many of memory cell transistors each with a low threshold voltage and an increase in total leak current caused by channel leak currents in the memory cell transistors lowers an output voltage of a charge pump circuit. Therefore, in a conventional method, by the reduction in output voltage of a charge pump circuit, a time was consumed to eliminate a problem of a memory cell transistor in an over-erased state and in a worse case, a function of such an elimination of a problem itself more problematically does not work.

FIG. 23 is a graph showing an applied drain voltage dependency in convergence of a threshold voltage when writing-back using sub-threshold CHE is performed.

Referring FIG. 23, symbols of a white circle, a white triangle and a white square indicate respective cases where applied drain voltages are 4 V, 3 V and 2 V. It is found that as a drain voltage decreases, convergence of threshold voltages takes more of time.

Referring again to FIG. 18, a curve A is an ideal write-back convergence curve when a current drive ability of a charge pump circuit is sufficient, while a curve B is a write-back convergence curve when a current drive ability of a charge pump circuit is exceeded with respect to the upper limits. In such a way, in a conventional write-back method, there was a case where it actually takes time for a threshold voltage Vth to converge as shown in the curve B, dissimilar to the ideal write-back curve A, causing a write-back fault to be generated in some case.

SUMMARY OF THE INVENTION

The present invention has been made to solve such a problem and it is an object of the present invention to provide a non-volatile semiconductor memory device capable of suppressing a write-back fault caused by an increase in channel leak current in a self-selective write-back method using sub-threshold CHE.

According to the present invention, a non-volatile semiconductor memory device includes: a memory cell array in which a plurality of floating gate type memory cell transistors is arranged in a matrix; a control circuit controlling an erase operation performed on the memory cell transistors as a prescribed single unit basis, and a write-back operation after the erase operation; a voltage generating circuit receiving an external power supply voltage to generate an internal power supply voltage and supplying the internal power supply voltage to memory cell transistors as the prescribed single unit basis to be written back in the write-back operation; and a resistance circuit connected to a source line of the plurality of memory cell transistors to cause a prescribed voltage drop by a current flowing in the source line.

Therefore, according to a non-volatile semiconductor memory device, a channel current in a write-back operation is suppressed and thereby, no chance arises that a write-back fault is generated due to an increase in channel leak current that exceeds a current drive ability of a charge pump circuit.

According to the non-volatile semiconductor memory device, no necessity arises for providing a special charge pump generating a negative substrate voltage which is described in the conventional technique for suppression of a channel current. In addition, there is no requirement for increase in a current drive ability of a charge pump circuit, that is it is not necessary to broaden a circuit area of a charge pump circuit either. Accordingly, an increase in device area can be suppressed and a low cost can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the drawings. Note that the same symbols are attached to the same or corresponding components in the figures and none of descriptions thereof will be repeated.

First Embodiment

Figure 1:
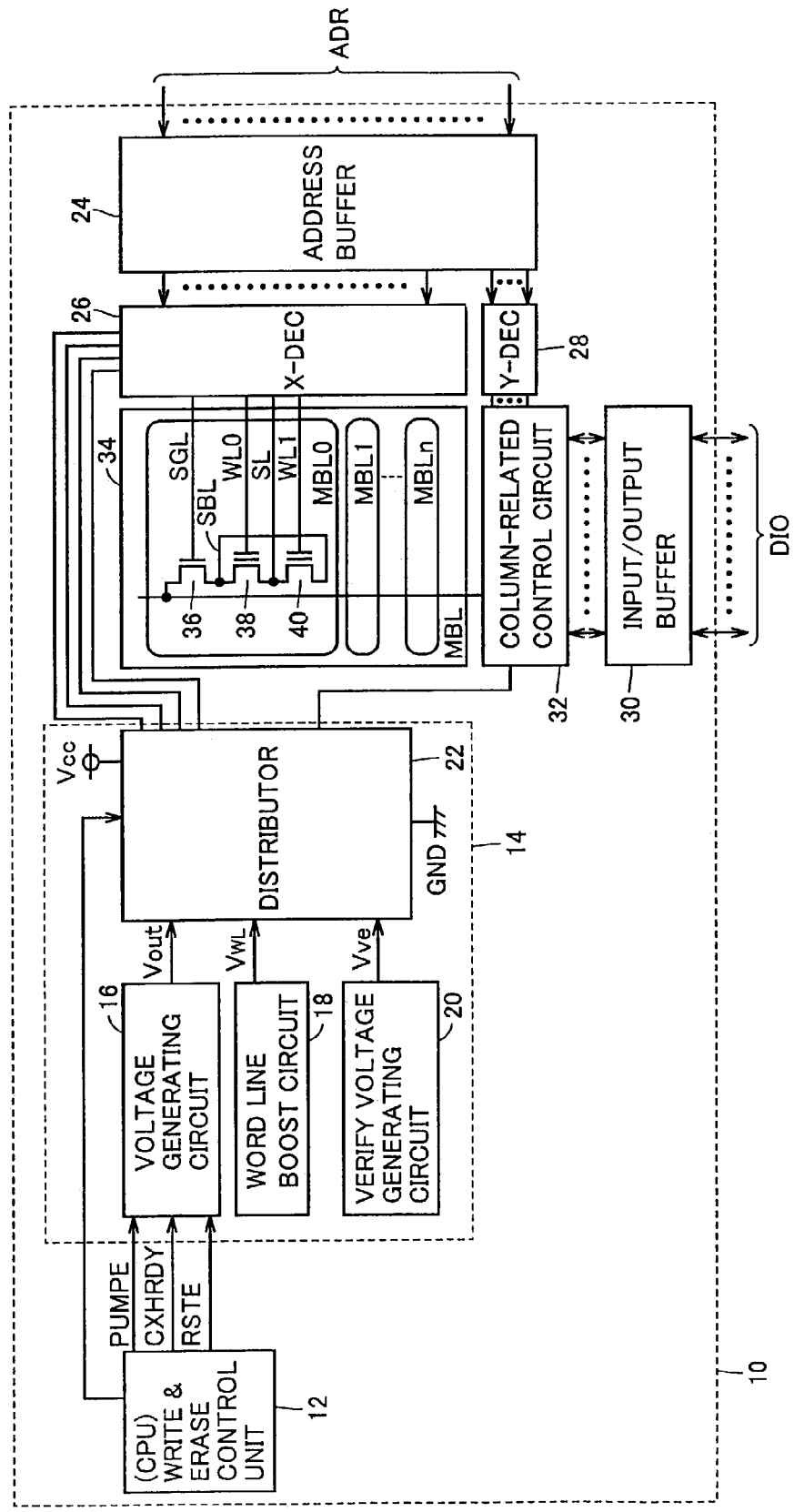
FIG. 1 is a schematic block diagram showing an overall configuration of a non-volatile semiconductor memory device according to the present invention.

FIG. 1 is a schematic block diagram showing an overall configuration of a non-volatile semiconductor memory device 10 according to the present invention.

Referring to FIG. 1, non-volatile semiconductor memory device 10 includes: a write & erase control section 12 using ROM inside itself to perform control of writing and erasure based on a program code held in the ROM; a voltage generating section 14 controlled by write & erase control section 12 to generate an output voltage Vout, a word line voltage $V_{WL}$ and a verify voltage Vve; an address buffer 24 receiving an address signal ADR from outside; an X decoder 26 receiving an internal address signal from address buffer 24 and receiving supply of a voltage from voltage generating section 14 to determine potentials of a select gate line SGL, word lines WL0 and WL1, a source line SL and a well; a Y decoder 28 receiving an internal address signal from address buffer 24 to decode the signal; an input/output buffer 30 for transmitting/receiving a data input-output signal DIO; a column-related control circuit 32 applying a voltage onto a main bit line MBL according to a data input/output signal based on an output of Y decoder 28; and a memory cell array 34.

Voltage generating section 14 includes: a voltage generating circuit 16 receiving a charge pump activating signal PUMPE, a standby signal CXHRDY and a reset signal RSTE to generate an output voltage Vout according to the signals; a word line boost circuit 18 generating word line voltage $V_{WL}$; a verify-voltage generating circuit 20 generating verify voltage Vve; and a distributor 22 controlled by write & erase control section 12, and receiving output voltage Vout, word line voltage $V_{WL}$ and verify voltage Vve to distribute the received voltages to internal circuits.

Voltage generating circuit 16 is a charge pump circuit receiving external power supply voltage Vcc and ground voltage GND to operate and generate output voltage Vout.

Word line boost circuit 18 generates a boosted potential supplied to selected word line WL and selected select gate SG in reading in order to realize a high speed access.

Verify voltage generating circuit 20 generates verify voltage Vve supplied to word line WL in a verify operation.

X decoder 26 includes: a WL decoder, not shown, for selecting word line WL; a SG decoder for selecting select gate SG; a WELL decoder for selecting a well region corresponding to a selected memory block; and a SL decoder for selecting a source line SL.

Column-related control circuit 32 includes: a sense amplifier performing data reading in a read operation and performing determination on a threshold voltage of a selected memory cell transistor in a verify operation; and a page buffer having a latch circuit to determine whether or not a voltage is applied onto main bit line MBL in writing based on latched data.

Memory cell array 34 includes memory blocks MBL0 to MBLn formed in respective isolated wells. An erase operation of non-volatile semiconductor memory device 10 is performed in each of memory blocks MBL0 to MBLn, each as a unit basis.

Memory block MBL0 includes memory cells 38 and 40, and a select gate 36. In memory block MBL0, a memory cell is selected corresponding to select gate line SGL, word lines WL0 and WL1 and source line SL, all selected by X decoder 26. In a write operation, a selected memory cell receives a signal corresponding to data from main bit line MBL through select gate 36 and sub-bit line SBL to hold data.

Note that in FIG. 1, there are typically shown memory cells 38 and 40, and select gate 36 corresponding to select gate line SGL, word lines WL0 and WL1, and source line SL, all selected.

That is, memory cell array 34 shown in FIG. 1 has a so-called DINOR type memory cell array structure in which bit lines are hierarchical, being organized with main bit line MBL and sub-bit lines SBL.

Note that while, for the sake of convenience, memory cell array 34 is of DINOR type memory cell array configuration, the present invention is not limited to this case, which will be made apparent in the following description, but may also be applied to a non-volatile semiconductor memory device having a so-called NOR type memory cell array configuration and, more generally, can be further applied to a non-volatile semiconductor memory device constructed of memory cell transistors each of floating gate structure.

Memory cell transistors 38, 40 and others included in memory cell array 34 shown in FIG. 1 has a configuration capable of a write-back operation using sub-threshold CHE described above.

Figure 2:
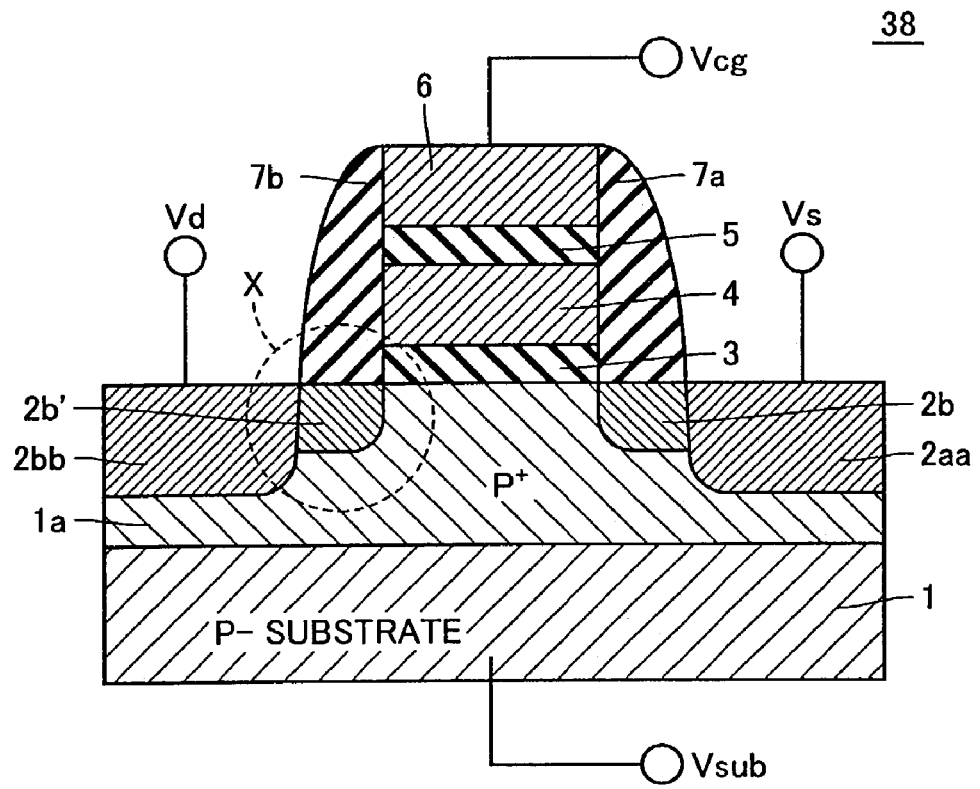
FIG. 2 is a schematic sectional view showing a structure of a memory cell shown in FIG. 1.
Figure 3:
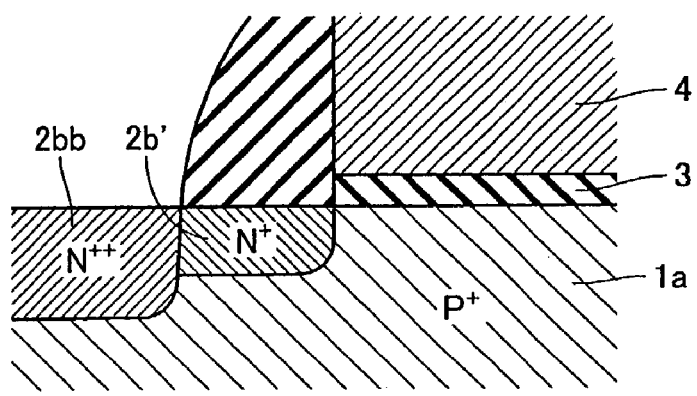
FIG. 3 is an enlarged sectional view showing a portion indicated with a dotted circle X in FIG. 2.

FIG. 2 is a sectional view schematically showing a structure of memory cell 38 shown in FIG. 1. FIG. 3 is an enlarged sectional view showing a portion indicated with a dotted circle X in FIG. 2.

Referring to FIGS. 2 and 3, a high concentration P-type region, that is a P$^+$ region (a first conductive type region) 1a is provided on a main surface of a P-type semiconductor substrate (semiconductor substrate) 1. Stacked on the P$^+$ region 1a are: a first gate insulating film (gate insulating film) 3; a floating gate 4 made of polycrystalline silicon or the like; a second gate insulating film 5, of a three layer structure constructed of an oxide film, a nitride film and an oxide film as a leakage preventive measure, and called ONO for short; and a control gate 6 made of polycrystalline silicon or the like, followed by production of the stacked structure in a gate shape. Sidewalls 7a and 7b, which are insulating films, are provided on the source and drain sides thereof. A two-storied gate electrode is constituted of floating gate 4, second gate insulating film 5 and control gate 6.

High concentration N-type regions, that is $N^+$ regions $2b$ and $2b'$ are provided, adjacent to the two-storied electrode. $N^+$ regions $2b'$ is an $N^+$ drain region as an electric field buffer layer and furthermore, high concentration N type source and drain regions, that is $N^{++}$ source region $2aa$ and $N^{++}$ drain region $2bb$, are provided with sidewalls $7a$ and $7b$ as spacers formed.

Brief description will be given of characteristic portions of the memory cell structure below.

As for an impurity profile of FIGS. 2 and 3, it has generally been known that an LDD (Lightly Doped Drain) structure has only to be used for suppression of a hot carrier degradation (generation of drain avalanche current) of a transistor. Therefore, of non-volatile semiconductor memory device 10 of FIG. 1, in a memory cell of a flash memory in which electron injection is performed with CHE, $N^+$ drain region $2b'$, which is a $N^+$ diffusion layer with a reduced concentration, is produced in the vicinity of a bottom portion of sidewall of $N^+$ drain region $2b$ abutting on $P^+$ region $1a$ to thereby suppress generation of a drain avalanche current; and in addition, a concentration in $P^+$ region $1a$ adjacent thereto is raised to thereby improve a CHE efficiency.

Figure 4:
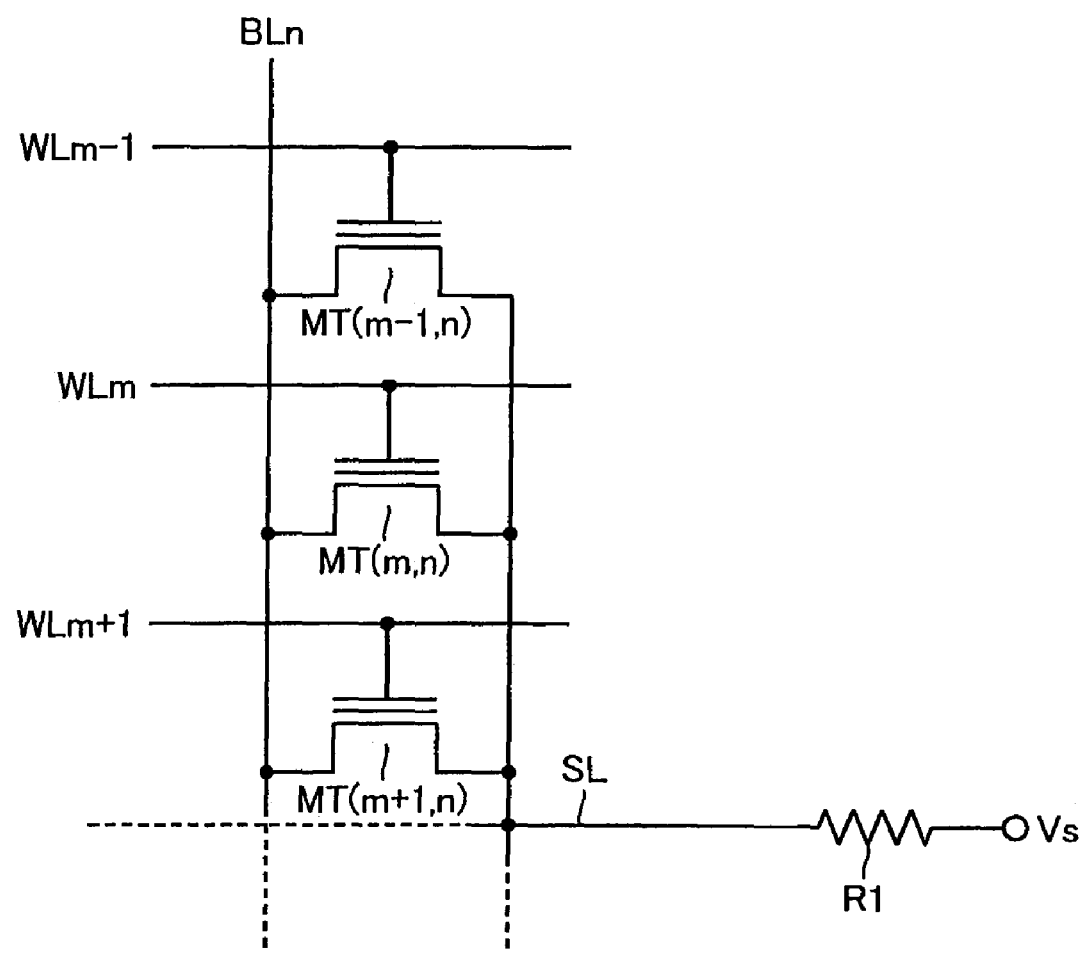
FIG. 4 is a circuit diagram schematically showing a circuit configuration of a memory cell array in the non-volatile semiconductor memory device shown in FIG. 1.

FIG. 4 is a circuit diagram schematically showing a circuit configuration of memory cell array 34 in non-volatile semiconductor memory device 10 shown in FIG. 1.

Referring to FIG. 4, memory cell transistors each having a memory cell structure described above are arranged in a matrix on memory cell array 34. Note that in FIG. 4, for description's sake, only a single row of memory cell transistors arranged in a matrix is shown and the following description will be given in the arrangement shown in FIG. 4.

Word lines WLm−1 to WLm+1 and bit line BLn are provided correspondingly to respective memory cell transistors arranged in a matrix. The drain, source and gate of each memory cell transistor are connected to a bit line, a source line and a word line, respectively. Description will be given of memory cell transistor MT (m, n), as example, wherein the drain of memory cell transistor MT (m, n) is connected to bit line BLn and the source is connected to source line SL common to the memory cell transistors and the gate is connected to word line WLm.

A resistor R1 is connected in series with source line SL common to the memory cell transistors. If a resistance value of resistor R1 is R and a total of channel currents flowing in the memory cell transistors in a write-back operation with sub-threshold CHE is I_CHE, by definition, a self-bias voltage of R×I_CHE is applied to the source regions of the memory cell transistors as a back gate voltage.

For example, in a case where a single writing-back on 64 kB is considered and when resistor R1 of R=100 Ω is adopted, a voltage of 100 Ω×4 mA=0.4 V for a leak current of 4 mA is applied to the source regions (hereinafter, this voltage is referred to as "back gate voltage").

With the back gate voltage applied, a channel leak current in a memory cell transistor in a state of a low threshold voltage, that is in an over-erased state, is suppressed at an initial stage of a write-back operation. Therefore, a total of leak currents is suppressed to less than the upper limit of a current drive ability of a charge pump circuit and thereby, a drain voltage without a voltage drop is supplied by a charge pump circuit.

Figure 5:
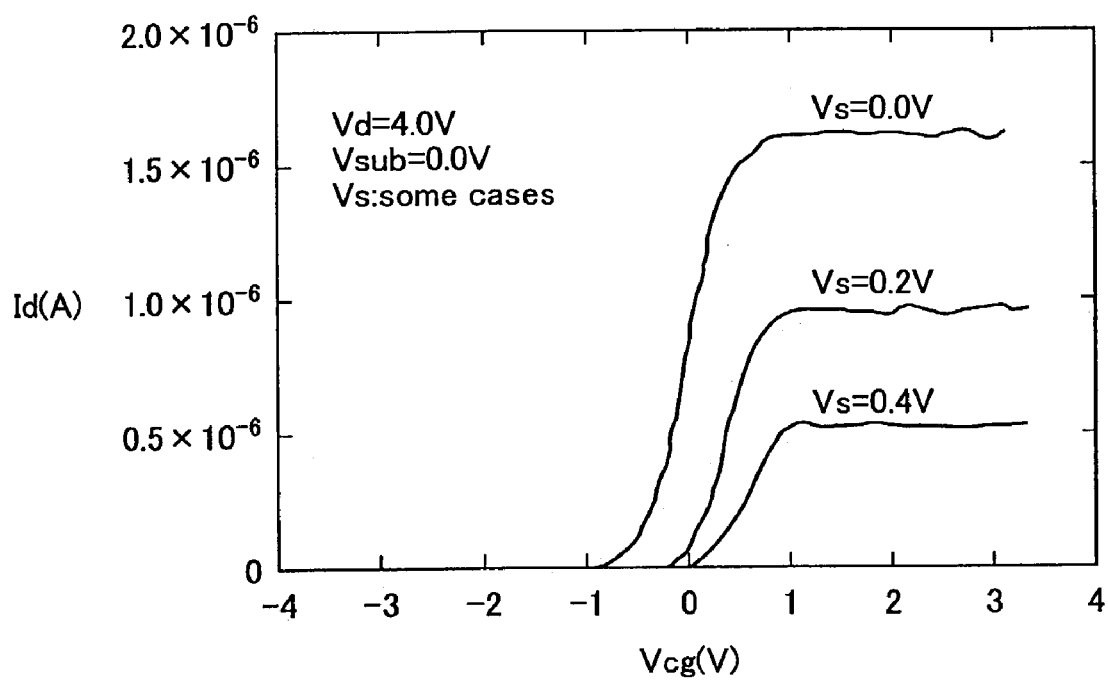
FIG. 5 is a graph showing a dependency of a channel current on a control gate voltage when a back gate voltage alters.

FIG. 5 is a graph showing a dependency of channel current Id on control gate voltage Vcg when a back gate voltage alters in a memory cell transistor having a memory cell structure described above. Here, source voltage Vs is altered under conditions that an initial value of a threshold voltage of the memory cell transistor is set to 2 V, drain voltage Vd=4 V and a substrate voltage Vsub=0 V.

Referring to FIG. 5, in a case of any value of source voltage Vs, as control gate voltage Vcg increases from a negative voltage as the start, channel current Id starts to increase from a voltage while raising control gate voltage Vcg. This is because a memory cell transistor is turned on by a rise in the floating gate voltage accompanying a rise in control gate voltage Vcg.

If control gate voltage Vcg continues to further rise, channel current Id stays at a constant value in any of cases of source voltages Vs regardless of a change in control gate voltage Vcg. This is considered because electrons flowing in a channel region are energetically raised in a high electric field region formed in the vicinity of the drain region by drain voltage Vd and injected into the floating gate; and even when control gate voltage Vcg is raised, electrons matching the increase are injected into the floating gate, with the result that a floating gate potential becomes almost unchanged, causing a channel current to be constant (a state where a channel current is constant is referred to a state of "channel current plateau").

As seen from FIG. 5, when a back gate voltage is 0.4 V, a channel leak current is restricted to about ⅓ times an amount when no back gate is applied.

Here, description will be given of improvement on an injection efficiency of CHE to the floating gate as a result of suppression of a channel current by applying of a back gate voltage.

In FIG. 5, if a threshold voltage only seemingly rises by application of a back gate voltage, it is also considered that a point at which channel current Id starts to flow owing to an increase in control gate voltage Vcg accompanying an increase in a back gate voltage only shifts to the high voltage side and a current value in a channel current plateau is constant despite of a back gate voltage.

However, the reason why a current value in a channel current plateau decreases according to a back gate voltage is considered that the number of electrons flowing through a channel is reduced by an increase in back gate voltage, whereby a state generates where energy of each of electrons are effectively raised in a high electric field region in the vicinity of the drain region, thereby improving an injection efficiency of CHE into the floating gate. That is, this is considered because since scattering between electrons is reduced by a decrease in the number of electrons, energy of each of electrons is more effectively enhanced with the result of improvement on an injection efficiency of CHE.

Therefore, it is considered that by applying a back gate voltage, an electron injection not inferior to a case where no back gate voltage is applied can be realized in a state of less of a channel current.

Here, a current level in a current plateau state where a current is suppressed by applying a back gate voltage is preferably ½ or less times a current level when no back gate is applied. This is because an area of a charge pump circuit can be reduced to about half or less of that when no back gate voltage is applied as a channel current is restricted to half or less of that when no back gate voltage is applied. It can be seen in FIG. 5 that this state is realized with back gate Vs of 0.2 V or higher. Therefore, resistor R1 giving a back gate voltage has only to have a resistance value R at which a back gate voltage of 0.2 V or higher arises.

Figure 6:
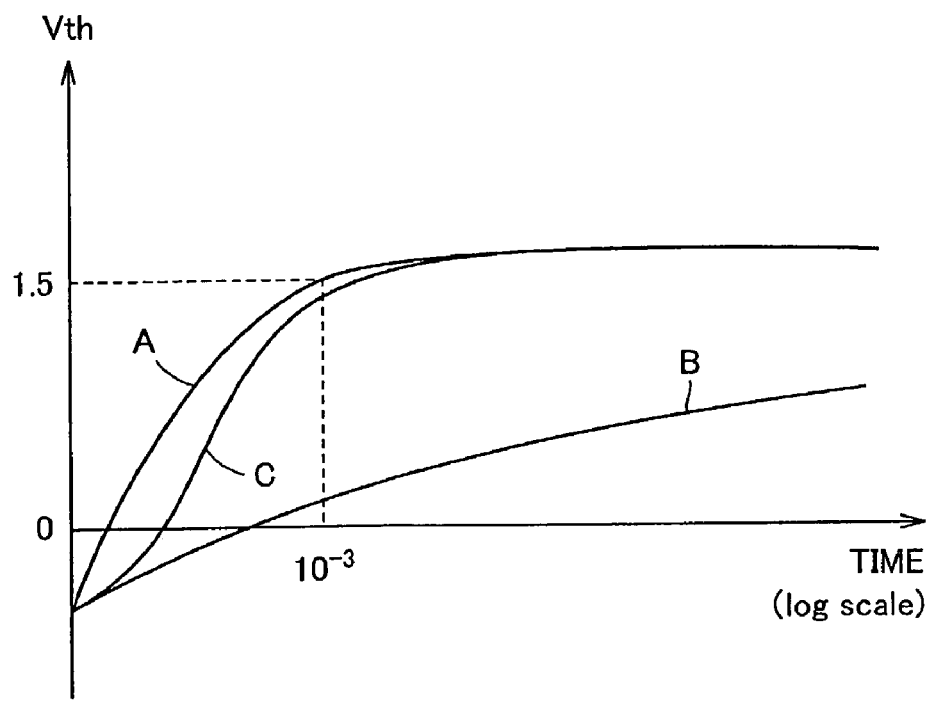
FIG. 6 is a graph showing a manner in which a memory cell transistor in an over-erased state is written back over time when a back gate voltage is applied.
Figure 18:
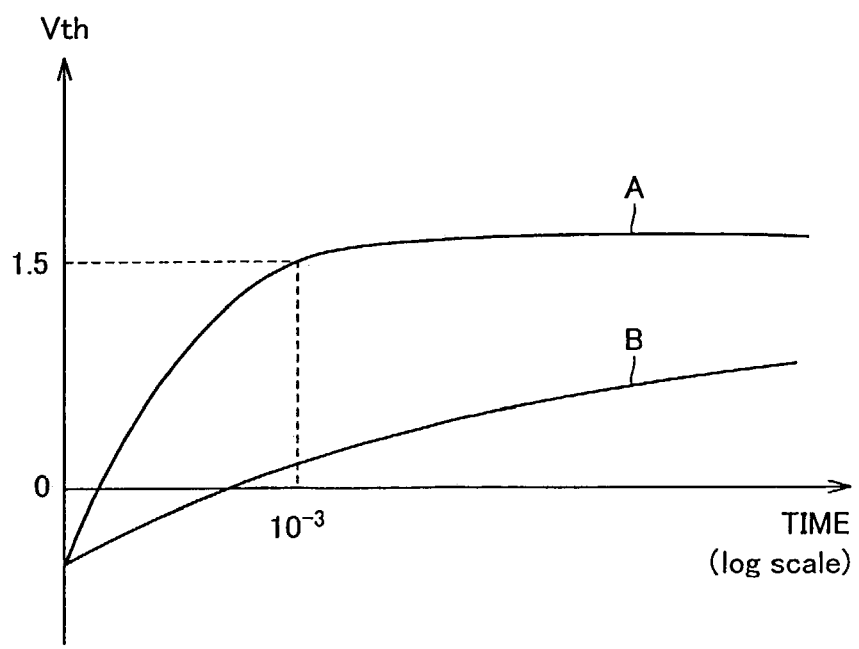
FIG. 18 is a graph showing a manner in which a memory cell transistor in an over-erased state is written back over time.
Figure 19:
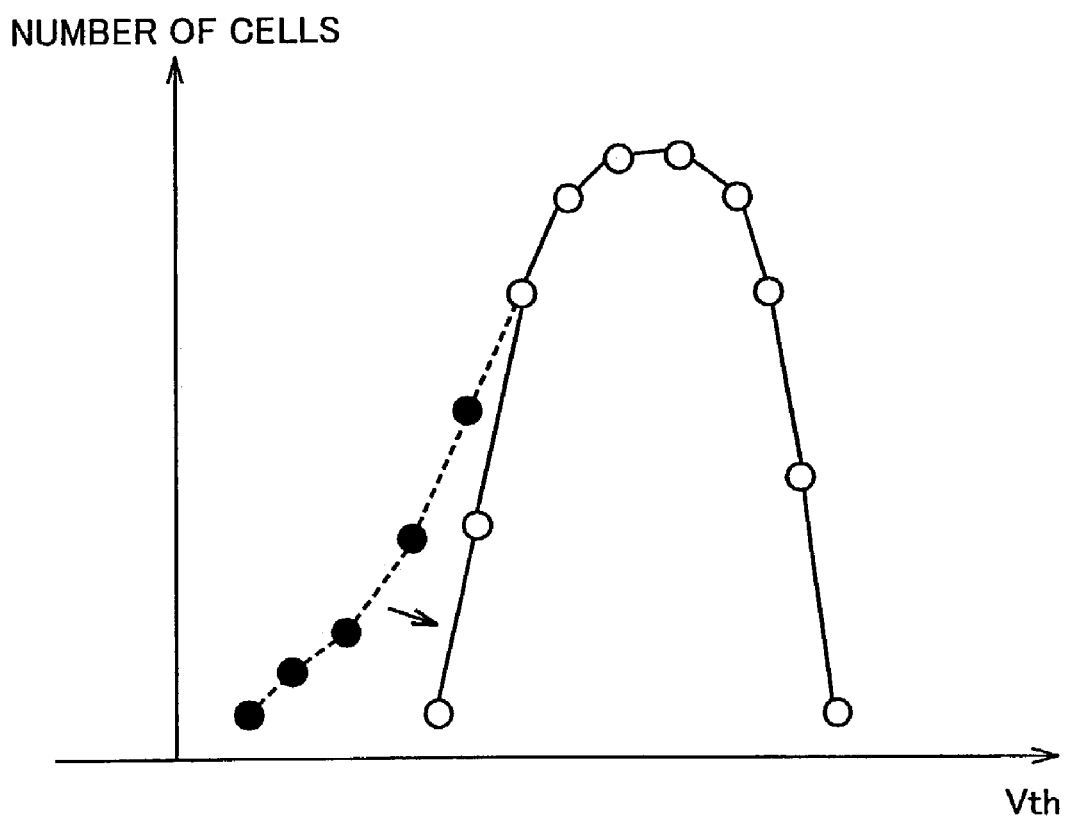
FIG. 19 is a graph showing a manner in which a memory cell transistor in an over-erased state has been written back and a distribution of a threshold voltage has been narrowed in width.
Figure 20:
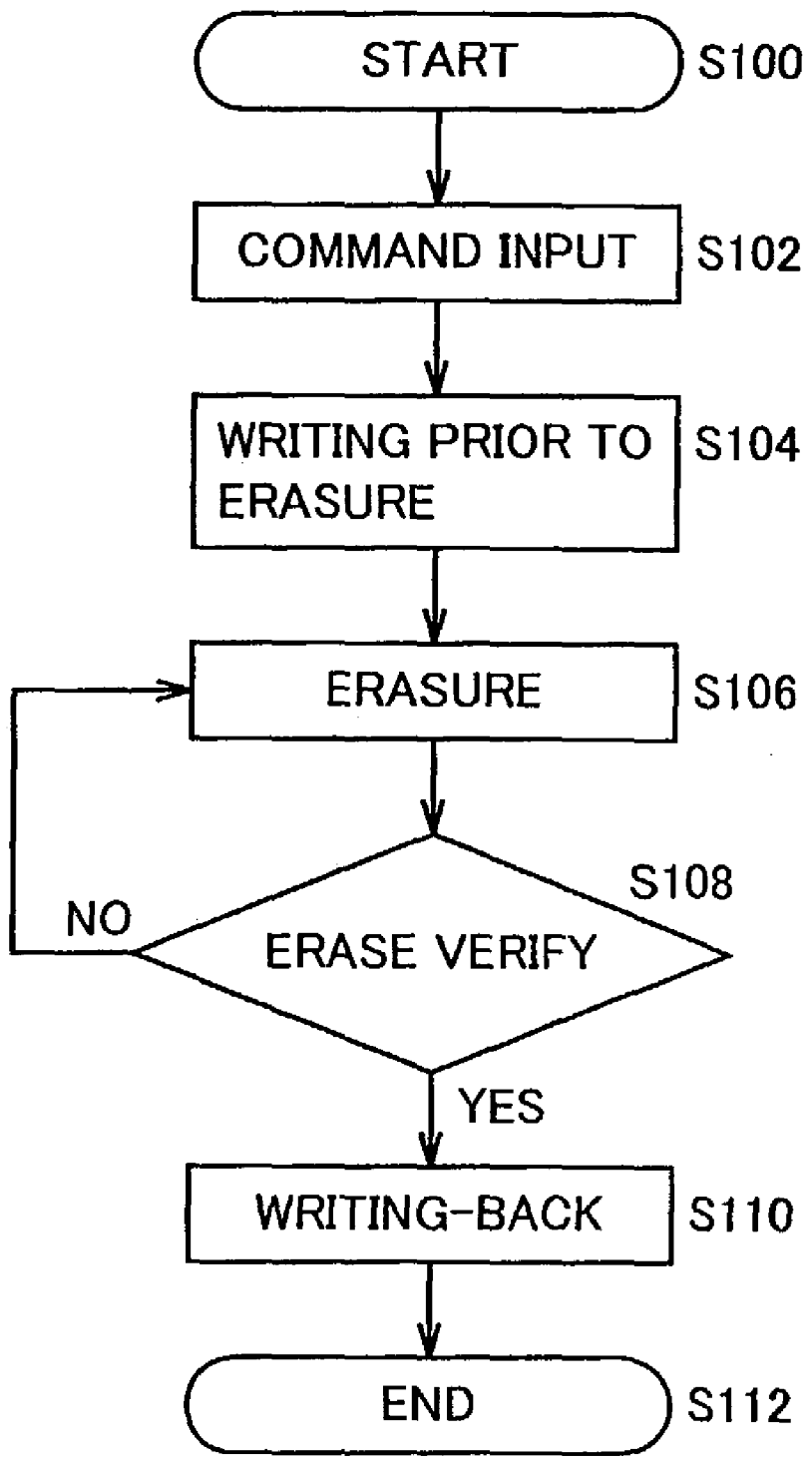
FIG. 20 is a flow chart for describing an erase sequence in writing-back using self-selective writing-back.
Figure 21:
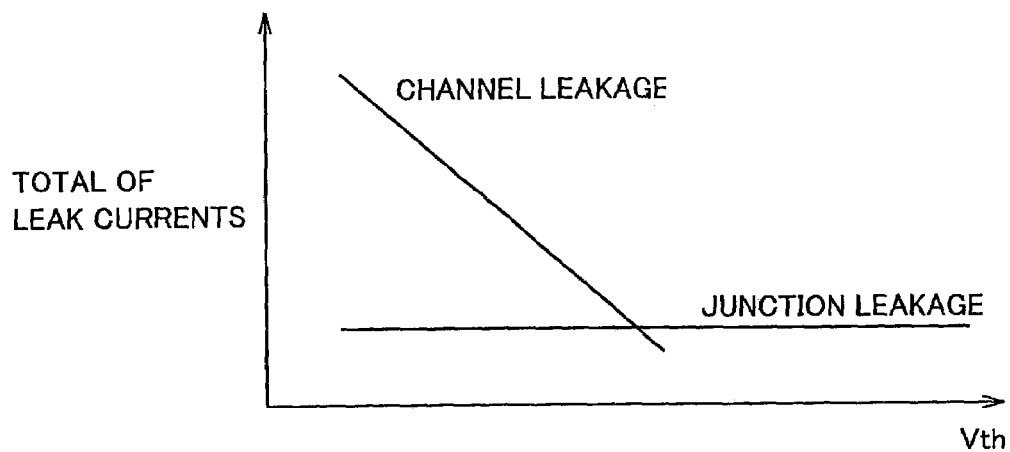
FIG. 21 is a graph conceptually describing a total of leak currents when a writing-back is singly performed on a prescribed number of memory cell transistors with a self-selective write-back method.
Figure 22:
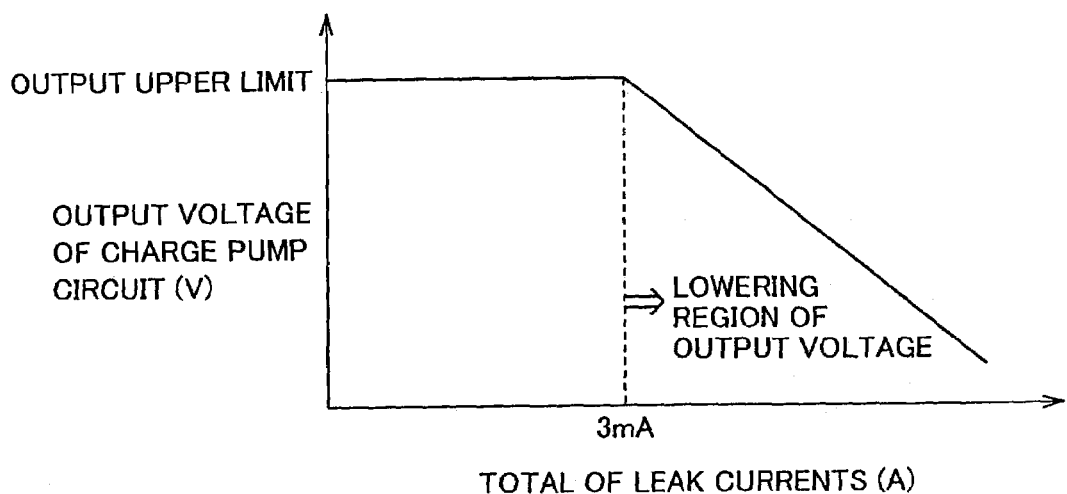
FIG. 22 is a graph showing a relationship between a total of leak currents in a write-back operation and an output voltage of a charge pump circuit.
Figure 23:
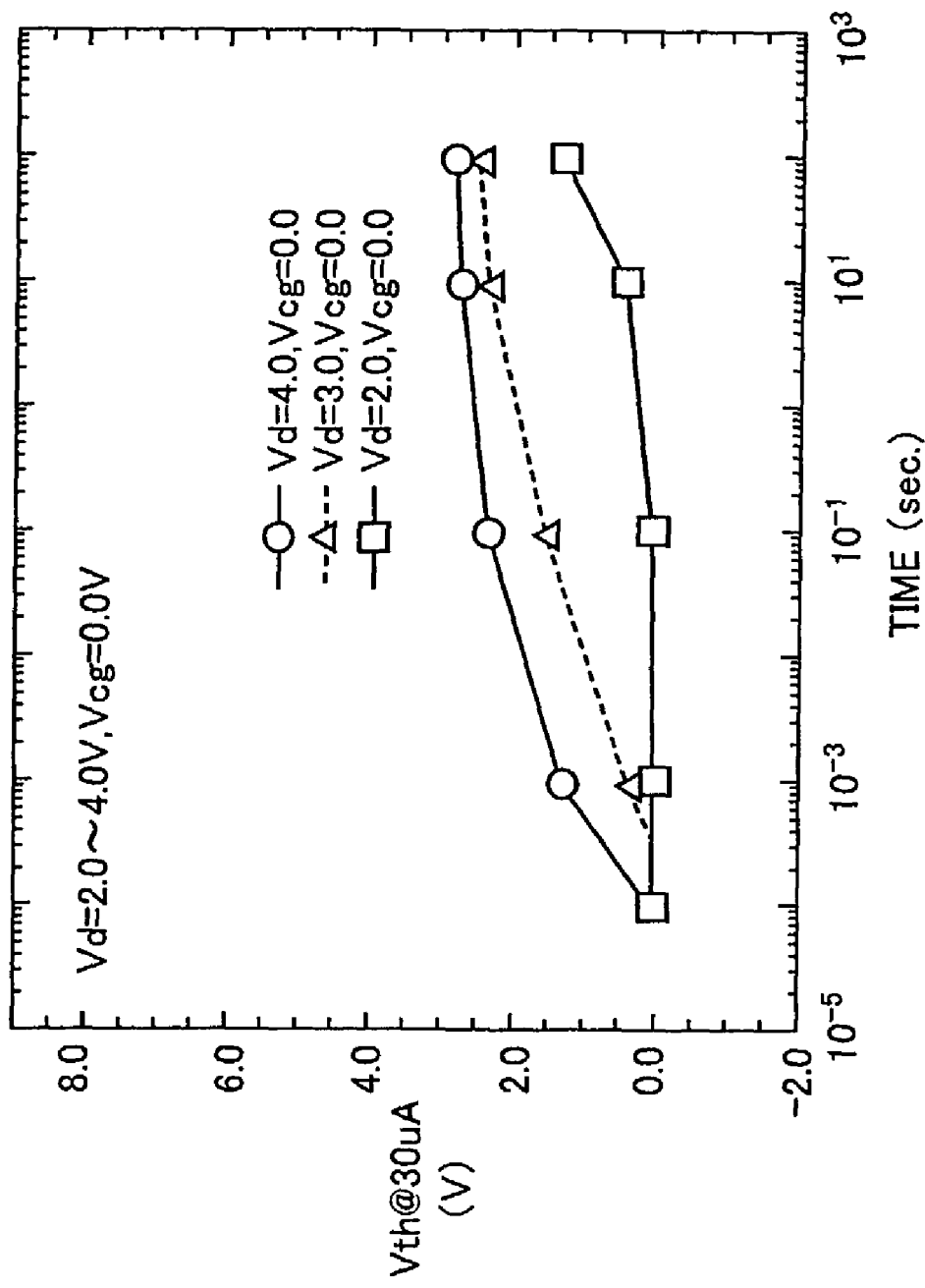
FIG. 23 is a graph showing an applied drain voltage dependency in convergence of a threshold voltage when writing-back using sub-threshold CHE is performed.

FIG. 6 is a graph showing a manner in which a memory cell transistor in an over-erased state is written back over time when a back gate voltage is applied. FIG. 6 is to add a convergence curve C of a threshold voltage when a back gate is applied, to convergence curves A and B in FIG. 18 shown in description of a conventional technique.

Referring to FIG. 6, description will be given to a state of convergence of a threshold voltage Vth when a back gate voltage is applied (curve C), at an initial stage of writing-back, drain voltage Vd is sustained by an effect of a back gate voltage, writing-back advances faster, as a result, in contrast to curve B when drain voltage Vd is reduced. As writing-back advances, a total of leak currents decreases; therefore, the back gate voltage gets smaller in a self-adjusting manner. As a result, the curve rapidly approaches the ideal convergence curve A when an ability of a charge pump circuit is sufficient without providing a back gate voltage.

Therefore, according to this method, an optimal writing-back can be performed in a self-adjusting manner without optimizing a back gate voltage so as to match a advancement of convergence of a threshold voltage.

Note that in non-volatile semiconductor memory device 10, a configuration may be adopted in which switching is made between a case where resistor R1 giving a back gate voltage is used and a case where no resistor R1 is used.

Figure 7:
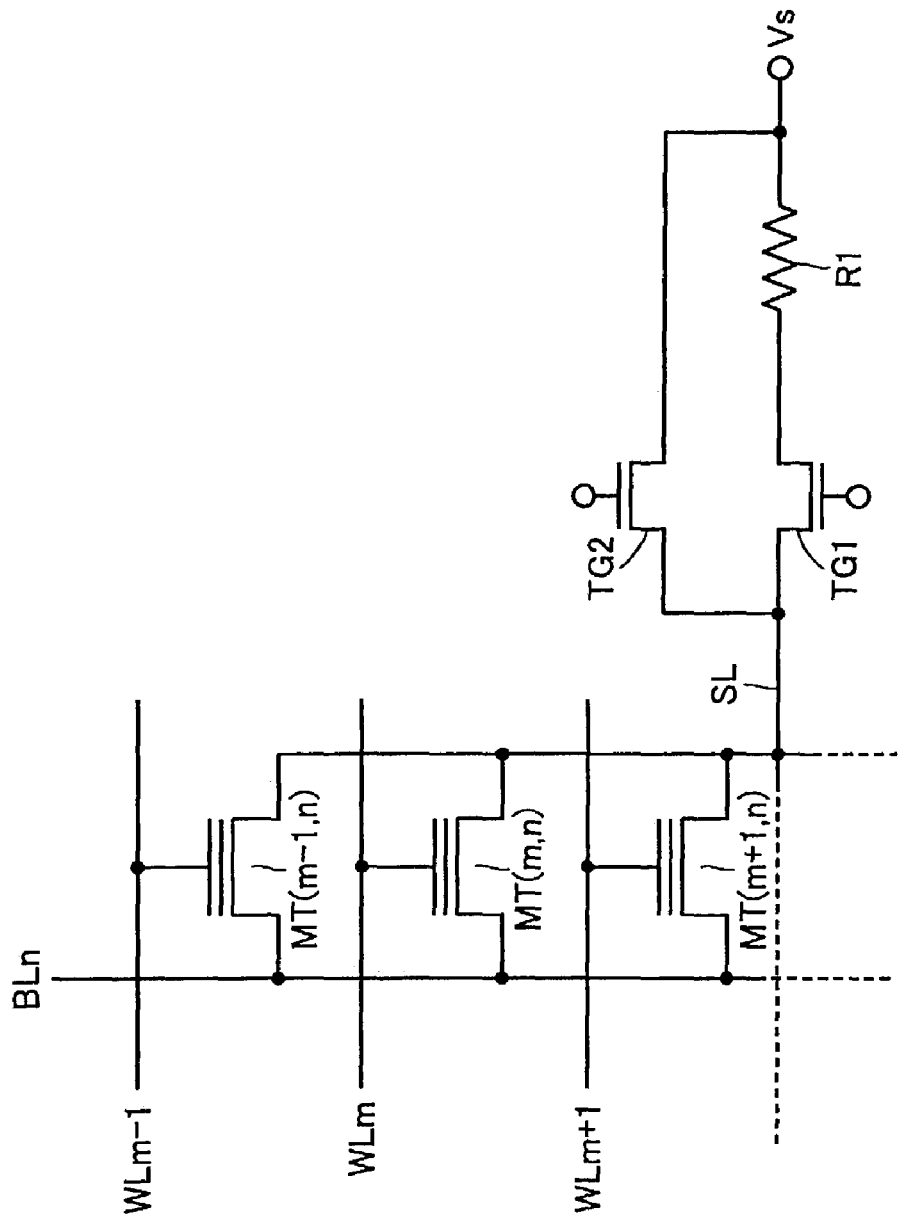
FIG. 7 is a circuit diagram schematically showing a circuit configuration of a memory cell array capable of switching between the use and non-use of a resistor giving a back gate voltage.

FIG. 7 is a circuit diagram schematically showing a circuit configuration of a memory cell array capable of switching between the use and non-use of resistor R1 in a non-volatile semiconductor memory device including resistor R1 giving a back gate voltage.

Referring to FIG. 7, this memory cell array further includes, in the configuration of the memory cell array shown in FIG. 4, a transistor TG1 connected in series with resistor R1, and a transistor TG2 connected in parallel to resistor R1 and transistor TG1.

In a case where a current drive ability of a charge pump circuit is insufficient in writing-back and when a back gate voltage is applied onto source line SL, transistor TG1 is turned on and transistor TG2 is turned off. On the other hand, when the memory cell array is operated without applying a back gate voltage onto source line SL, transistor TG1 is turned off and transistor TG2 is turned on.

As described above, according to non-volatile semiconductor memory device 10 of the first embodiment, a back gate voltage is applied with resistor R1 connected in series with source line; therefore, a channel current is suppressed in writing-back and there is no chance for a write-back fault to generate because of an increase in channel current exceeding a current drive ability of a charge pump circuit.

According to non-volatile semiconductor memory device 10, no necessity arises for providing a special charge pump circuit serving so as to generate a negative substrate voltage, which has been described in the description associated with the conventional technique herein. Moreover, no requirement arises for an increase in current drive ability of the charge pump circuit, that is no need arises for an increase in circuit area of the charge pump circuit. Accordingly, an increase in a device area can be suppressed and a low cost can be realized.

Second Embodiment

In the second embodiment, a transistor with a narrowed channel width is used instead of resistor R1 for generating a back gate voltage used in non-volatile semiconductor memory device 10 according to the first embodiment.

Since an overall configuration of a non-volatile semiconductor memory device according to the second embodiment is the same as the overall configuration of non-volatile semiconductor memory device 10 according to the first embodiment shown in FIG. 1, no description thereof is repeated. Furthermore, since a memory cell structure of the non-volatile semiconductor memory device according to the second embodiment is the same as the memory cell structure shown in FIGS. 2 and 3, no description thereof will be repeated either.

Figure 8:
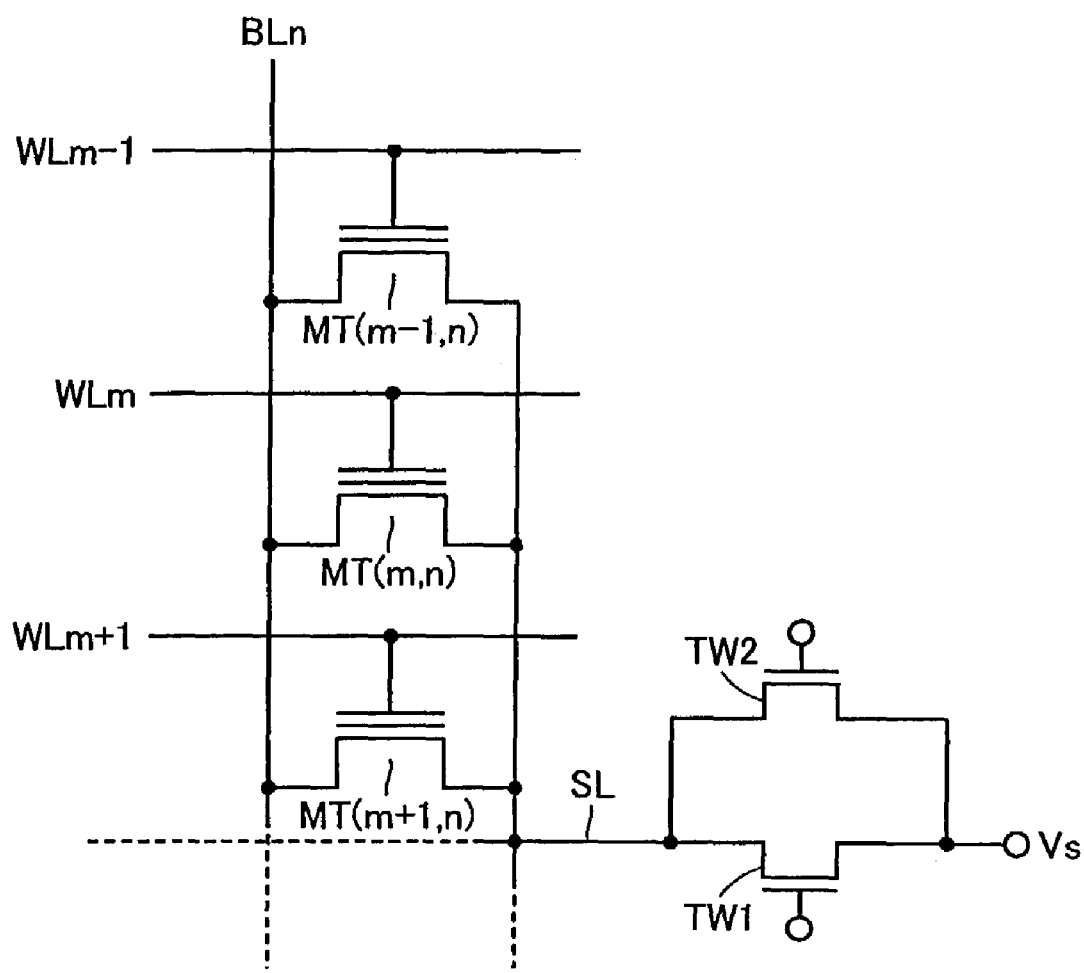
FIG. 8 is a circuit diagram schematically showing a circuit configuration of a memory cell array in a non-volatile semiconductor memory device according to a second embodiment.

FIG. 8 is a circuit diagram schematically showing a circuit configuration of a memory cell array in a non-volatile semiconductor memory device according to the second embodiment.

Referring to FIG. 8, the memory cell array includes, in the configuration of the memory cell array of FIG. 4, transistors TW1 and TW2 in parallel connection to each other instead of resistor R1. Transistor TW1 is designed so as to be narrower in channel width and higher in on-resistance value than transistor TW2.

In a case where a current drive ability of a charge pump circuit is insufficient in writing-back and when a back gate voltage is applied onto source line SL, transistor TW1 narrower in channel width and higher in on-resistance is turned on and transistor TW2 is turned off. On the other hand, when a lower back gate voltage is applied, transistor TW1 is turned off and transistor TW2 wider in channel width and lower in on-resistance is turned on.

As described above, according to a non-volatile semiconductor memory device of the second embodiment, transistor TW1 narrow in channel width and high in on-resistance is provided as a resistor giving a back gate voltage, thereby enabling a lower cost to be realized without a necessity for a special resistor in addition to the effect described in the first embodiment.

Third Embodiment

In the third embodiment, a transistor longer in gate length is used instead of resistor R1 for generating a back gate voltage used in non-volatile semiconductor memory device 10 according to the first embodiment.

Since an overall configuration of a non-volatile semiconductor memory device according to the third embodiment is the same as that of non-volatile semiconductor memory device 10 according to the first embodiment shown in FIG. 1, no description thereof is repeated. Moreover, a memory cell structure of a non-volatile semiconductor memory device according to the third embodiment is the same as the memory cell structure shown in FIGS. 2 and 3, no description thereof will be repeated either.

Figure 9:
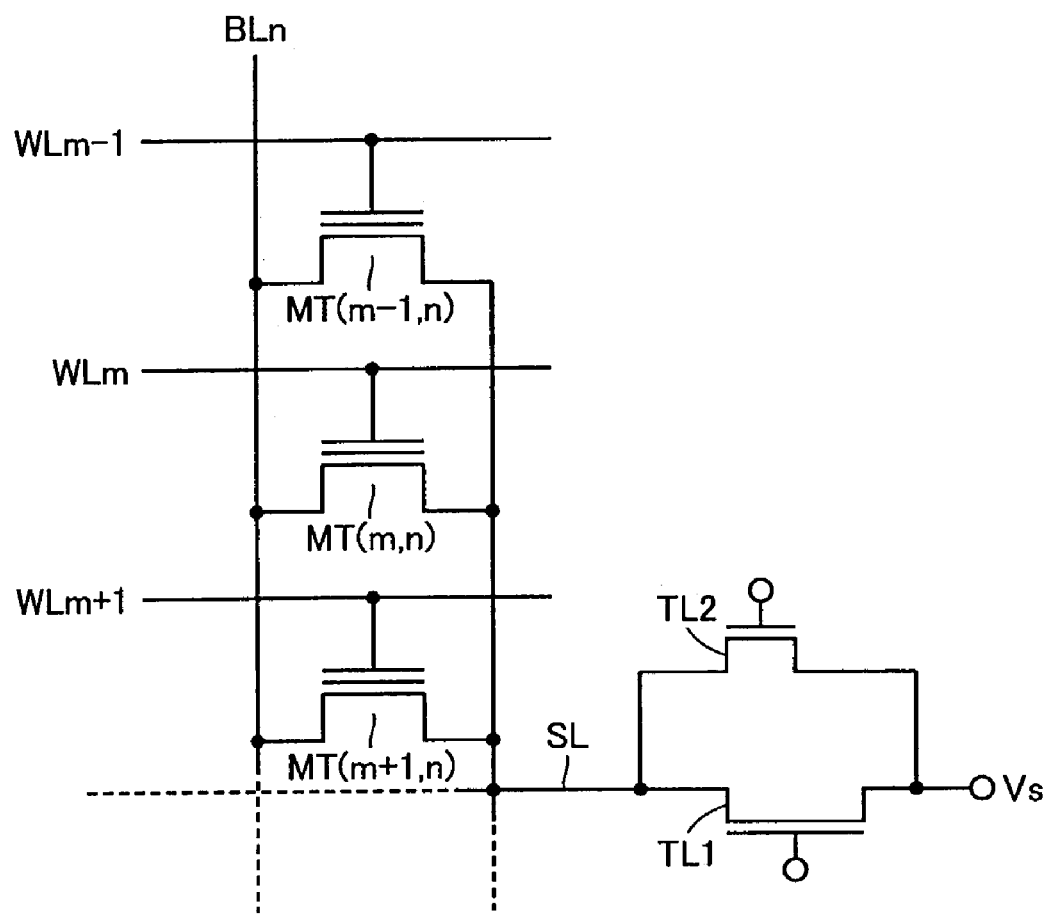
FIG. 9 is a circuit diagram schematically showing a circuit configuration of a memory cell array in a non-volatile semiconductor memory device according to a third embodiment.

FIG. 9 is a circuit diagram schematically showing a circuit configuration of a memory cell array in a non-volatile semiconductor memory device according to the third embodiment.

Referring to FIG. 9, the memory cell array includes, in the configuration of the memory cell array shown in FIG. 4, TL1 and TL2 in parallel connection to each other instead of resistor R1. Transistor TL1 is longer in gate length and higher in on-resistance than transistor TL2.

In a case where a current drive ability of a charge pump circuit is insufficient in writing-back and when a back gate voltage is applied onto source line SL, transistor TL1 longer in gate length and higher in on resistance is turned on and transistor TL2 is turned off. On the other hand, when a lower back gate voltage is used, transistor TL1 is turned off and transistor TL2 shorter in gate length and lower in on-resistance is turned on.

As described above, according to a non-volatile semiconductor memory device according to the third embodiment, transistor TL1 long in gate length and high in on-resistance is provided as a resistor giving a back gate voltage, thereby enabling a lower cost to be realized without a necessity for a special resistance element in addition to the effect described in the first embodiment.

Fourth Embodiment

While in the first embodiment, a single resistor R1 is installed as a resistor for generating a back gate voltage, in the fourth embodiment, a plurality of resistors different in resistance value from each other are provided in parallel connection to each other and used selectively.

Since an overall configuration of a non-volatile semiconductor memory device according to the fourth embodiment is the same as that of non-volatile semiconductor memory device 10 according to the first embodiment shown in FIG. 1, no description thereof will be repeated. Furthermore, since a memory cell structure of a non-volatile semiconductor memory device according to the fourth embodiment is the same as the memory cell structure shown in FIGS. 2 and 3, no description thereof will be repeated either.

Figure 10:
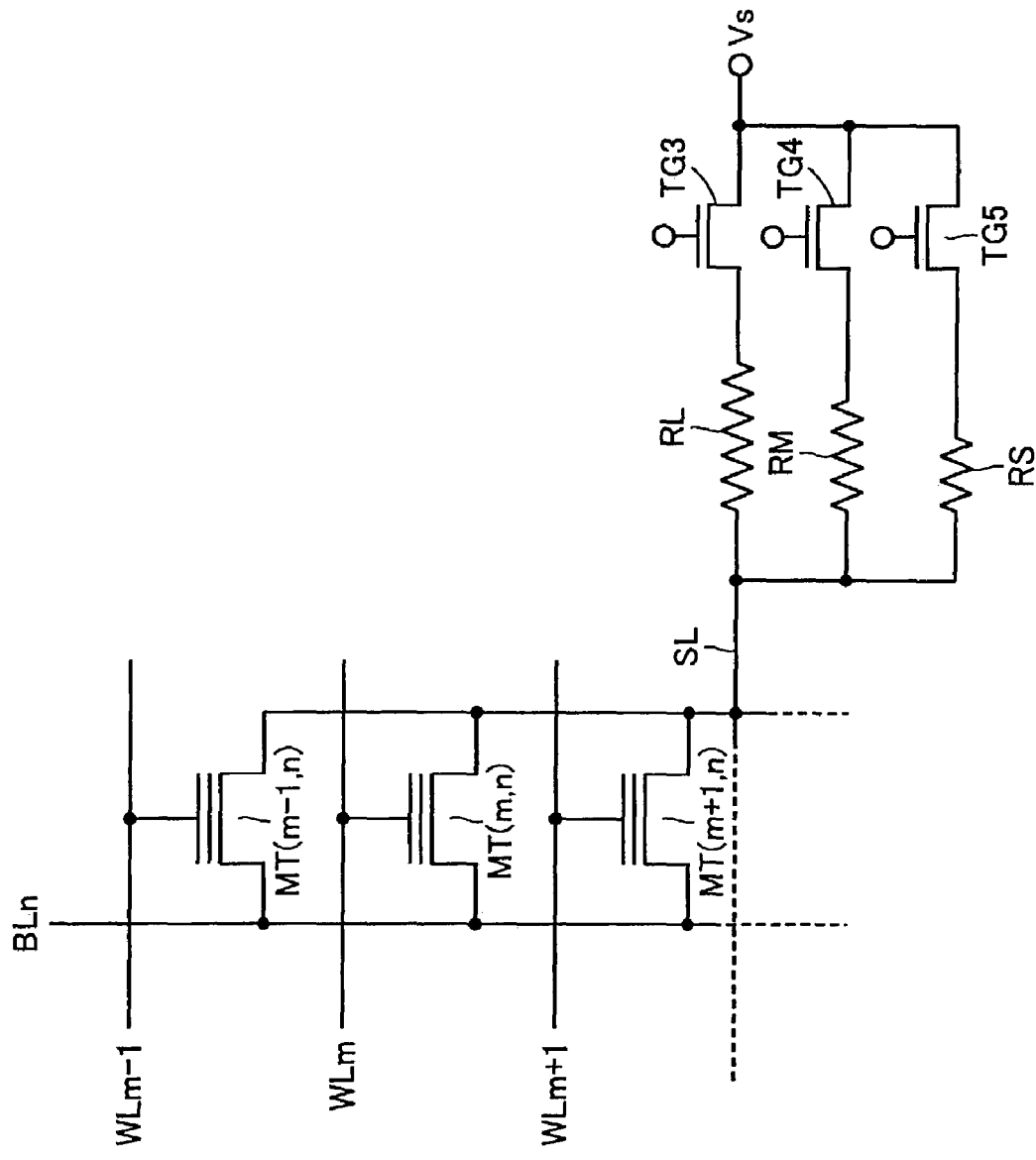
FIG. 10 is a circuit diagram schematically showing a circuit configuration of a memory cell array in a non-volatile semiconductor memory device according to a fourth embodiment.
Figure 11:
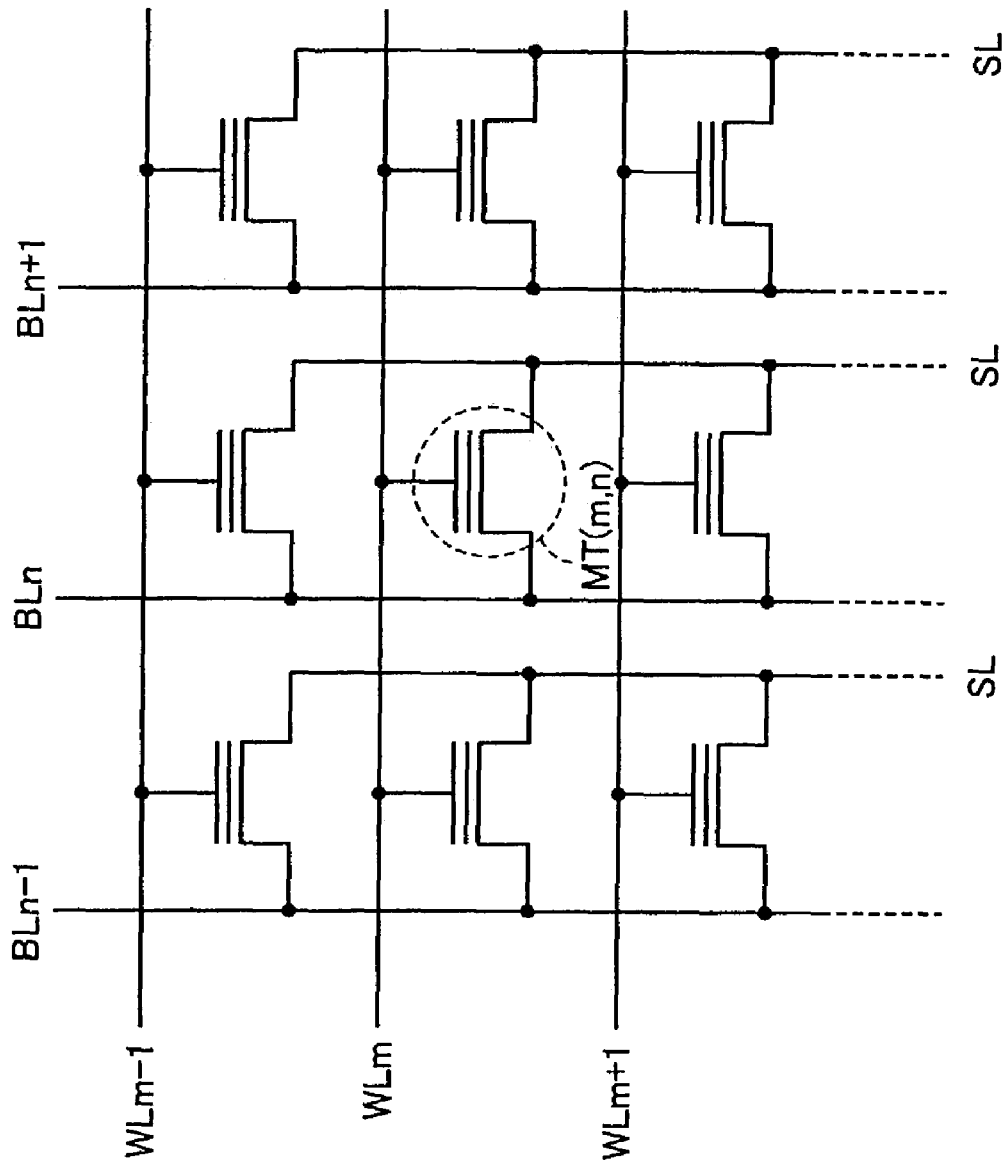
FIG. 11 is a circuit diagram showing a circuit configuration of a memory cell array in a non-volatile semiconductor memory device such as a conventional flash memory.
Figures 12, 13:
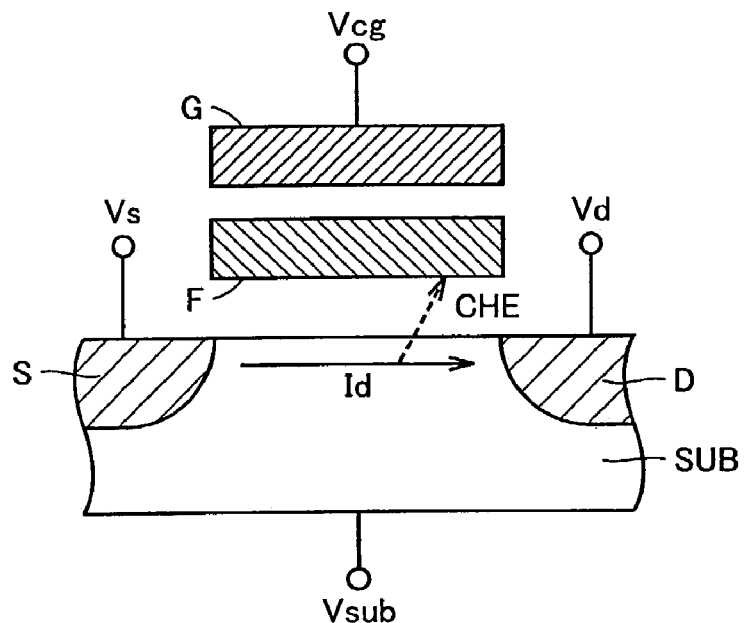
FIG. 12 is a sectional view schematically showing a structure of a floating gate type memory cell transistor.
FIG. 13 is a table showing a general voltage arrangement in data writing with CHE in the floating gate type memory cell transistor shown in FIG. 12.
Figure 14:
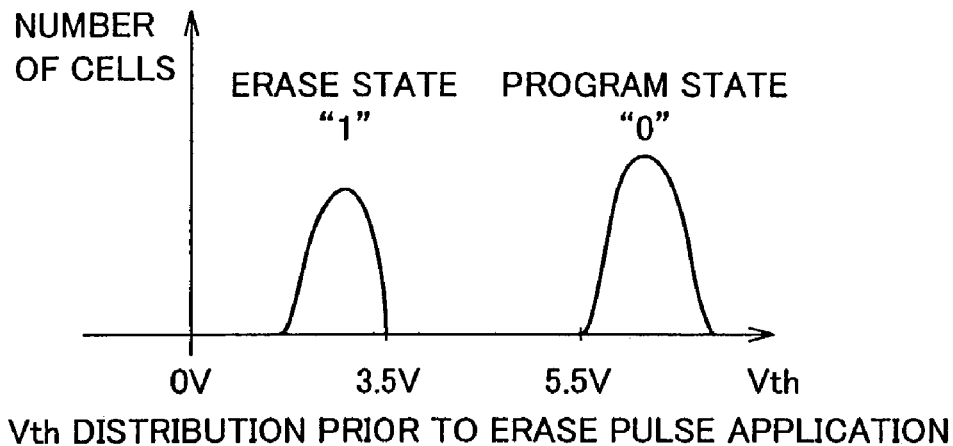
FIG. 14 is a graph showing a distribution of values of a threshold voltage prior to erasure.
Figure 15:
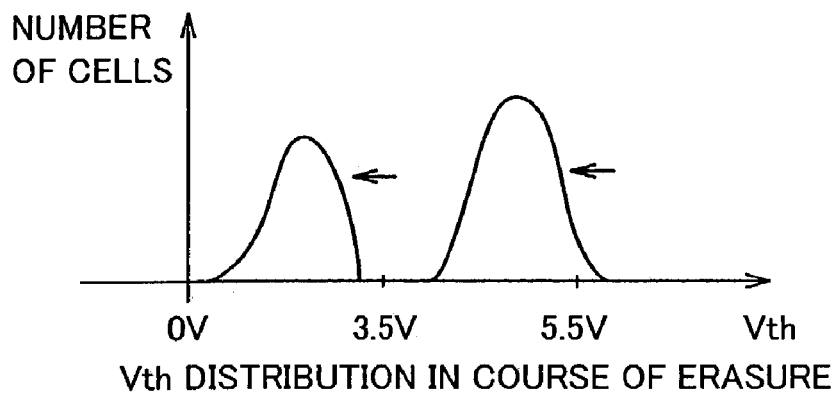
FIG. 15 is a graph showing a distribution of a threshold voltage in the course of erasure.
Figure 16:
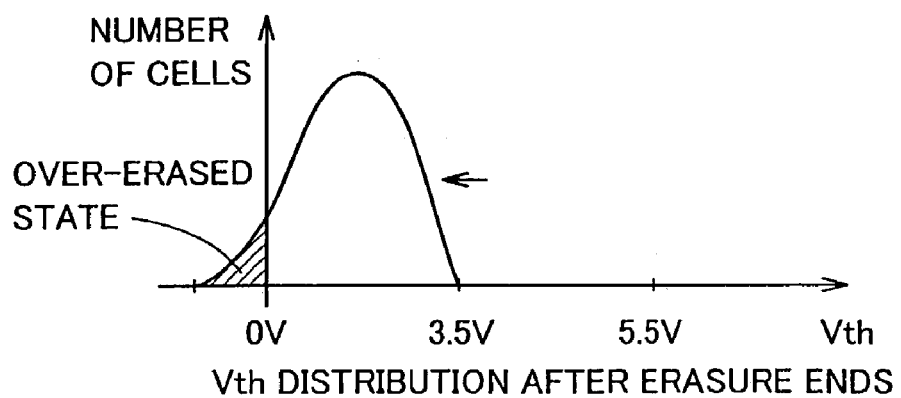
FIG. 16 is a graph showing a distribution of a threshold voltage after erasure ends.
Figure 17:
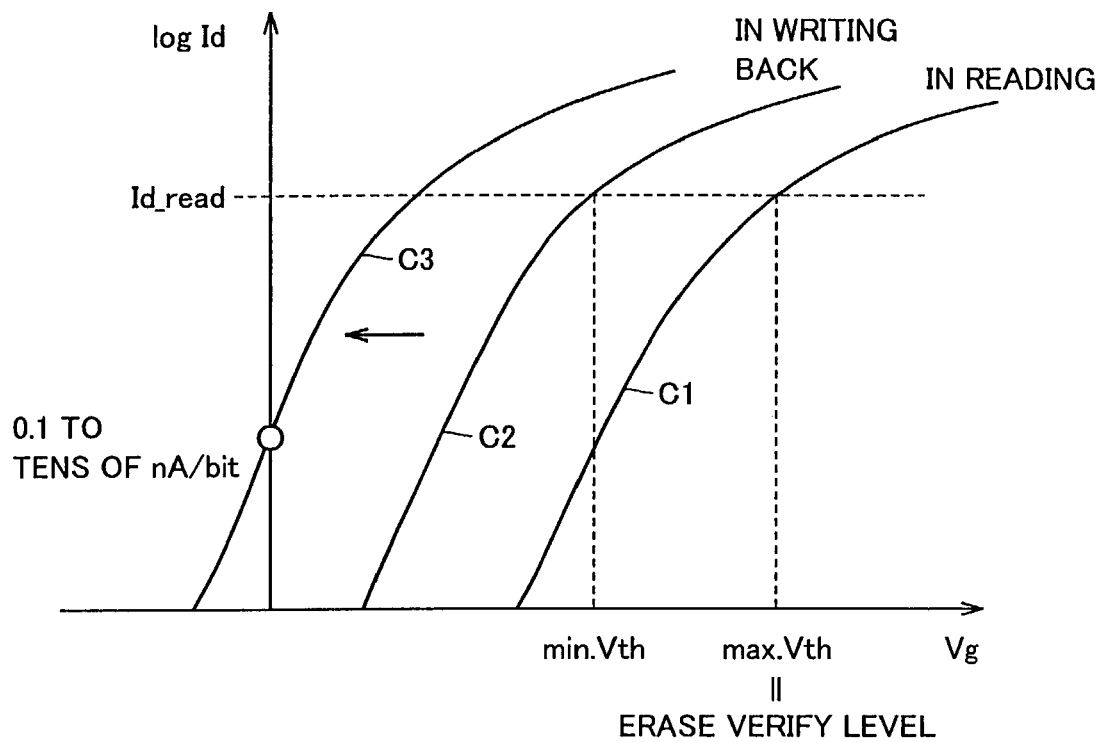
FIG. 17 is a graph conceptually showing a gate voltage dependency of a drain current of a single memory cell transistor.

FIG. 10 is a circuit diagram schematically showing a circuit configuration of a memory cell array in a non-volatile semiconductor memory device according to the fourth embodiment.

Referring to FIG. 10, the memory cell array is configured so that in the configuration of the memory cell array shown in FIG. 4, there are provided, instead of R1, a plurality of resistors RL, RM and RS different in resistance value from each other and there are further provided transistors TG3 to TG5 for selecting respective resistors RL, RM and RS. Resistors RL, RM and RS are connected in parallel to each other and transistors TG3, TG4 and TG5 are provided correspondingly to resistors RL, RM and RS. As to magnitudes of resistance values of resistors RL, RM and RS, a resistance value of resistor RL is a maximum and resistors RM and RS follow in the order.

It is required that at an initial stage of writing-back, a sufficient back gate voltage is applied onto a source line by connecting a resistor high in resistance value in series with the source line and a channel current is suppressed so that the upper limit of a current drive ability of charge pump circuit is exceeded. As writing-back advances, however, a total of channel leak currents decreases in a self-adjusting manner; therefore, a problem of a current drive ability of a charge pump circuit is solved. On the other hand, without a problem of a current drive ability, a larger channel current generates an absolutely larger number of CHE, which advances writing-back faster, even in consideration of the presence of improvement on a CHE injection efficiency due to suppression of a channel current. Therefore, in the fourth embodiment, a voltage to be applied to a memory cell to be written back in writing-back is applied in the form of a plurality of pulses each having a prescribed width and switching is made between resistors for applying a back gate voltage according to the number of given pulses.

At an initial stage of writing-back, transistors TG3 to TG5 are turned on, off and off, respectively and resistor RL high in resistance value is selected. Thereby, a channel current is suppressed while the upper limit of a current drive ability of a charge pump circuit is not exceeded to perform writing-back.

When the number of write-back pulses exceeds a prescribed number, transistors TG3 to TG5 is turned off, on and off, respectively and resistor RM lower in resistance value than resistor RL is selected. Furthermore, when the number of write-back pulses further increases, transistors TG3 to TG5 is turned off, off and on, respectively and a resistance RS lower in resistance value than resistor RM is selected.

Note that while in the above description, three resistors for giving a back-gate voltage is provided, the number of resistors is not limited to 3 but a proper number of resistors are provided according to a capacity of a memory block on which a collective writing-back is performed, a capacity of a charge pump circuit or the like.

As described above, according to a non-volatile semiconductor memory device according to the fourth embodiment, there are provided a plurality of resistors different in resistance value from each other as resistors giving a back gate voltage and a resistor lower in resistance than the previous one is sequentially selected as writing-back advances, thereby enabling proper write-back operation to be realized in the entire period from the initial stage till the end.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a memory cell array including a plurality of floating gate memory cell transistors arranged in a matrix, wherein each of said memory cell transistors includes:
        first and second diffusion regions of a second conductivity type opposite each other, with a channel region of a first conductivity type interposed therebetween, in a surface layer section of a semiconductor substrate including the non-volatile semiconductor memory device,
        a two-layer gate electrode having a floating gate and a control gate opposite said channel region of said first conductivity type, with a gate insulating film interposed therebetween, and
        an electric field buffer layer of said second conductivity type between said first diffusion region and said channel region of said first conductivity type and between said second diffusion region and said channel region of said first conductivity type, not overlapping said two-layer electrode;
    a control circuit controlling an erase operation of said memory cell transistors on a single unit basis, and a write-back operation after the erase operation;
    a voltage generating circuit receiving an external power supply voltage to generate an internal power supply voltage and supplying the internal power supply voltage to memory cell transistors on the single unit basis, to be written back in the write-back operation; and
    a resistance circuit connected to a source line of said plurality of memory cell transistors and causing a voltage drop due to a current flowing in said source line.

2. The non-volatile semiconductor memory device according to claim 1, wherein, in said write-back operation, by holding a potential of said control gate at an inactive level, and setting one of said first and second diffusion regions to a ground potential while setting the other of said first and second diffusion regions to a prescribed potential, self-selective writing-back with a sub-threshold channel hot electron current is performed.

3. A non-volatile semiconductor memory device comprising:
- a memory cell array including a plurality of floating gate memory cell transistors arranged in a matrix;
- a control circuit controlling an erase operation of said memory cell transistors on a single unit basis, and a write-back operation after the erase operation;
- a voltage generating circuit receiving an external power supply voltage to generate an internal power supply voltage and supplying the internal power supply voltage to memory cell transistors on the single unit basis, to be written back in the write-back operation; and
- a resistance circuit connected to a source line of said plurality of memory cell transistors and causing a voltage drop due to a current flowing in said source line, wherein said resistance circuit includes a first transistor having a first channel width and a prescribed on-resistance.

4. The non-volatile semiconductor memory device according to claim 3, wherein said voltage generating circuit has sufficient current drive ability for driving channel currents suppressed by said resistance circuit in said respective memory cell transistors on the single unit basis, to be written back in the write-back operation.

5. The non-volatile semiconductor memory device according to claim 3, wherein
- said resistance circuit further includes a second transistor having a second channel width wider than said first channel width,
- said second transistor is connected to said source line, in parallel with said first transistor, and
- said first transistor and said second transistor are selectively turned on and off according to an instruction from said control circuit.

6. The non-volatile semiconductor memory device according to claim 3, wherein the voltage drop is at least 0.2 V.

7. A non-volatile semiconductor memory device comprising:
- a memory cell array including a plurality of floating gate memory cell transistors arranged in a matrix;
- a control circuit controlling an erase operation of said memory cell transistors on a single unit basis, and a write-back operation after the erase operation;
- a voltage generating circuit receiving an external power supply voltage to generate an internal power supply voltage and supplying the internal power supply voltage to memory cell transistors on the single unit basis, to be written back in the write-back operation; and
- a resistance circuit connected to a source line of said plurality of memory cell transistors and causing a voltage drop due to a current flowing in said source line, wherein said resistance circuit includes a first transistor having a first gate length and a prescribed on-resistance.

8. The non-volatile semiconductor memory device according to claim 7, wherein
- said resistance circuit further includes a second transistor having a second gate length shorter than said first gate length,
- said second transistor is connected to said source line in parallel with said first transistor, and
- said first transistor and said second transistor are selectively turned on and off according to an instruction from said control circuit.

9. A non-volatile semiconductor memory device comprising:
- a memory cell array including a plurality of floating gate memory cell transistors arranged in a matrix;
- a control circuit controlling an erase operation of said memory cell transistors on a single unit basis, and a write-back operation after the erase operation;
- a voltage generating circuit receiving an external power supply voltage to generate an internal power supply voltage and supplying the internal power supply voltage to memory cell transistors on the single unit basis, to be written back in the write-back operation; and
- a resistance circuit connected to a source line of said plurality of memory cell transistors and causing a voltage drop due to a current flowing in said source line, wherein said resistance circuit includes:
  - a plurality of resistance elements different in resistance from each other, and
  - a plurality of switch circuits respectively corresponding to said resistance elements, wherein said plurality of resistance elements are connected to said source line in parallel to each other, and, of said plurality of switch circuits, according to an instruction from said control circuit, a switch circuit corresponding to the resistance element having the highest resistance is selectively turned on at an initial stage of writing-back, and, as writing-back advances, switch circuits corresponding to resistance elements having respective resistances are sequentially selectively turned on in decreasing order of resistances of the resistance elements.

10. The non-volatile semiconductor memory device according to claim 9, wherein, in said write-back operation, writing-back is performed by applying a plurality of pulses of the internal power supply voltage to memory cell transistors on the single unit basis to be written back, and as the number of pulses increases, said switch circuits corresponding to said resistance elements having the respective resistances are sequentially selectively turned on in the decreasing order of the resistances of the resistance elements.

11. The non-volatile semiconductor memory device according to claim 9, wherein said voltage generating circuit has sufficient current drive ability for driving channel currents suppressed by said resistance circuit in said respective memory cell transistors on the single unit basis, to be written back in the write-back operation.

12. The non-volatile semiconductor memory device according to claim 9, wherein the voltage drop is at least 0.2 V.

* * * * *